US012651964B2

(12) United States Patent (10) Patent No.: US 12,651,964 B2
Wang et al. (45) Date of Patent: Jun. 9, 2026

(54) POWER DEVICE

(71) Applicant: Delta Electronics (Shanghai) Co., Ltd., Shanghai (CN)

(72) Inventors: Kun-Peng Wang, Shanghai (CN); He-Zhuang Hu, Shanghai (CN); Dong-Lin Fu, Shanghai (CN); Kai Dong, Shanghai (CN); Jin-Fa Zhang, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 346 days.

(21) Appl. No.: 18/409,772

(22) Filed: Jan. 10, 2024

(65) Prior Publication Data

US 2024/0146187 A1 May 2, 2024

Related U.S. Application Data

(63) Continuation-in-part of application No. 16/953,365, filed on Nov. 20, 2020, now Pat. No. 11,901,108, (Continued)

(30) Foreign Application Priority Data

| | | | |
|---|---|---|---|
| May 25, 2016 | (CN) | ......................... | 201610352569.3 |
| Dec. 20, 2017 | (CN) | ......................... | 202311772906.0 |
| Dec. 20, 2017 | (CN) | ......................... | 202323503657.3 |

(51) Int. Cl.
*H01F 27/24* (2006.01)
*H02M 1/42* (2007.01)
(Continued)

(52) U.S. Cl.
CPC ............ *H02M 3/003* (2021.05); *H01F 27/24* (2013.01); *H02M 1/42* (2013.01); *H02M 3/3353* (2013.01);
(Continued)

(58) Field of Classification Search
CPC ...... H02M 3/003; H02M 1/42; H02M 3/3353; H02M 1/4225; H02M 3/33576;
(Continued)

(56) References Cited

U.S. PATENT DOCUMENTS 8,421,578 B2 4/2013 Huang et al.
2002/0057158 A1 5/2002 Matsumoto et al.
(Continued)

FOREIGN PATENT DOCUMENTS

CN 1099530 A 3/1995
CN 1615675 A 5/2005
(Continued)

*Primary Examiner* — Shawki S Ismail
*Assistant Examiner* — Kazi S Hossain
(74) *Attorney, Agent, or Firm* — CKC & Partners Co., LLC

(57) ABSTRACT

A power device includes a mainboard and a power conversion module. The mainboard includes a first side and a third side opposite each other along a first direction, a second side and a fourth side opposite each other along a second direction, the first direction is perpendicular to the second direction. The power conversion module includes a primary-side circuit board and a secondary-side module. The secondary-side module includes a secondary-side circuit board, and the primary-side circuit board, the mainboard and the secondary-side circuit board being electrically connected, the primary-side circuit board and the secondary-side circuit board are spatially separated. The secondary-side module further includes secondary-side element and a first magnetic core element, wherein the secondary-side element and the first magnetic core element are disposed on the secondary-side circuit board along a third direction perpendicular to the first direction and the second direction.

18 Claims, 34 Drawing Sheets

Related U.S. Application Data which is a continuation-in-part of application No. 15/600,913, filed on May 22, 2017, now Pat. No. 10,847,455.

(51) Int. Cl.
  *H02M 3/00* (2006.01)
  *H02M 3/335* (2006.01)
  *H05K 1/181* (2026.01)

(52) U.S. Cl.
  CPC ..... *H05K 1/181* (2013.01); *H05K 2201/1003* (2013.01)

(58) Field of Classification Search
  CPC .. H02M 1/0085; H02M 3/01; H02M 3/33573; H02M 1/0058; H02M 1/007; H01F 27/24; H01F 2027/2809; H01F 27/40; H01F 27/2804; H01F 2027/2819; H05K 1/181; H05K 2201/1003; H05K 1/0263; H05K 1/165; H05K 2201/10393; H05K 2201/086; H05K 2201/09063; H05K 2201/10053; H05K 2201/10166; H05K 2201/1028; H01L 25/072; H01L 25/18; H01L 25/16; H10D 1/20; Y02B 70/10
  USPC ......................................... 336/221, 212, 180
  See application file for complete search history.

(56) References Cited

U.S. PATENT DOCUMENTS

| | | | |
|---|---|---|---|
| 2003/0142513 A1 | 7/2003 | Vinciarelli | |
| 2005/0024179 A1 | 2/2005 | Chandrasekaran et al. | |
| 2005/0110606 A1 | 5/2005 | Vinciarelli | |
| 2007/0072447 A1* | 3/2007 | Busletta ................. | H05K 1/165 439/68 |
| 2007/0201211 A1 | 8/2007 | Loiler et al. | |
| 2008/0024259 A1 | 1/2008 | Chandrasekaran et al. | |
| 2009/0309684 A1 | 12/2009 | Tsai et al. | |
| 2010/0026090 A1* | 2/2010 | Nakatsu ................. | H02M 7/003 307/9.1 |
| 2010/0141371 A1 | 6/2010 | Wang | |
| 2010/0164670 A1* | 7/2010 | Nakahori .............. | H01F 27/306 336/200 |
| 2010/0321960 A1 | 12/2010 | Nakahori | |
| 2012/0212314 A1* | 8/2012 | Li ..................... | H02M 3/33592 336/192 |
| 2012/0322309 A1* | 12/2012 | Xu ...................... | H01F 27/2823 29/605 |
| 2013/0278373 A1 | 10/2013 | Hara et al. | |
| 2014/0063721 A1 | 3/2014 | Herman et al. | |
| 2014/0170904 A1* | 6/2014 | Tang ................. | H01R 13/6633 439/620.23 |
| 2014/0266530 A1 | 9/2014 | Andres et al. | |
| 2015/0048917 A1 | 2/2015 | Uchiyama et al. | |
| 2015/0282370 A1 | 10/2015 | Yang et al. | |
| 2015/0348694 A1 | 12/2015 | Sakuma et al. | |
| 2016/0088754 A1* | 3/2016 | Francis ................. | H05K 13/04 361/752 |
| 2016/0241150 A1 | 8/2016 | Hsu et al. | |
| 2018/0040410 A1* | 2/2018 | Hamada .............. | H05K 1/0262 |

FOREIGN PATENT DOCUMENTS

| | | |
|---|---|---|
| CN | 201160024 Y | 12/2008 |
| CN | 201708703 U | 1/2011 |
| CN | 202142997 U | 2/2012 |
| CN | 203205229 U | 9/2013 |
| CN | 103348577 A | 10/2013 |
| CN | 103378748 A | 10/2013 |
| CN | 105099132 A | 11/2015 |
| JP | 2010193536 A | 9/2010 |
| JP | 2011023633 A | 2/2011 |

* cited by examiner

Vin — Primary Winding Circuit — Isolation Transformer — Secondary Winding Circuit — Vo

1300C

1300B

1500

C100

C300

C300

C400

C510

POWER DEVICE

CROSS-REFERENCE TO RELATED APPLICATIONS

This application is a Continuation-in-part of U.S. application Ser. No. 16/953,365, filed on Nov. 20, 2020, which is a Continuation-in-part of U.S. application Ser. No. 15/600, 913, filed on May 22, 2017 and issued on Nov. 24, 2020 (U.S. Pat. No. 10,847,455), which claims priority of China Application Serial Number 201610352569.3, filed on May 25, 2016, and this application claims priority of China Application Serial Number 202311772906.0, filed on Dec. 20, 2023, and this application claims priority of China Application Serial Number 202323503657.3, filed on Dec. 20, 2023, the entirety of which are incorporated by reference herein in their entireties.

BACKGROUND

Technical Field

The present disclosure relates to the field of electronic technology. More particularly, the present disclosure relates to a power device.

Description of Related Art

In present, power supplies are moving towards standardized sizes, and power densities of power supplies are getting higher at the same time, which leads to the layout space of devices being limited under limited spaces in the power supplies, as an increase in the power density induces difficulties in heat dissipation inside the power supply.

Take a common redundant power supply (CRPS) with a length of 185 mm as an example, a power supply with a power below 2400 W often adopt a traditional pin-type transformer with windings, which has a larger volume, and the pins further occupies the layout space of the mainboard. As the power increases to 3200 W, if traditional transformers are still adopted, the layout space of the mainboard will be limited at first, and in addition, since the power is increased, the power loss is also increased, which leads to a challenge of heat dissipation.

In the fields of server and telecom or the like, the conventional power device includes main board, at least one power module mounted on the main board and other functional components. Further, main power semiconductor devices are integrated in the power module. The design of the power module is particularly important for achieving high efficiency, high power density, high reliability and low cost.

FIG. 1A shows a structural block diagram of a conventional power module. The power module includes a primary winding circuit, a secondary winding circuit, and an isolation transformer between the primary winding circuit and the secondary winding circuit. FIG. 1B shows a schematic perspective diagram of a conventional power module. As shown in FIG. 1B, the conventional power module includes a PCB 31, an isolation transformer 32, a primary winding circuit 33 and a secondary winding circuit 34. The isolation transformer 32 is located in middle of the PCB 31, and the primary winding circuit 33 and the secondary winding circuit 34 are positioned on the PCB 31 and located on opposite sides of the isolation transformer 32.

In low-voltage and large-current applications, an architecture of a transformer that a plurality of primary windings connected in series and a plurality of secondary windings connected in parallel is generally employed in order to improve the power density and efficiency of the power device. Referring to a schematic circuit diagram of a conventional power module as shown in FIG. 1C. For a conventional circuit as shown in FIG. 1C, it is difficult to achieve a series connection or a parallel connection of two or more isolation transformers in a single power module, due to the arrangement of the primary winding and secondary winding of the transformer.

If it is desired to further increase the power, the only way for the conventional architecture of power module is to increase the number of layers of the PCB. However, when PCB layers increase, it will introduce a number of problems such as significant increase in PCB costs, heat-dissipation difficulty of the inner layer of the PCB windings, the increase in loss caused by current unbalance of the PCB layers, and so on. The isolation transformer blocks the normal air flow, and thus the primary winding circuit 33 or the secondary winding circuit 34 suffers from overheating, which results in low conversion efficiency of the power device. In addition, in the conventional power device, the electrical path between the secondary winding of the isolation transformer and the secondary winding circuit is long, and the connection trace is relatively long. For example, the length of the connection trace is up to 40 mm, thereby increasing trace loss of the power device, which is not beneficial to improve the power density and efficiency of the power device.

The above information disclosed in the background technology section is only used to facilitate understanding the background of the present disclosure, and thus it may include information which does not construct the prior art well-known by the person skilled in the related art.

SUMMARY

Based on above, the present disclosure provides a power device to improve one or more problems in prior art.

One aspect of the present disclosure provides a power device including a mainboard and a power conversion module. The mainboard includes a first side and a third side opposite each other along a first direction, and a second side and a fourth side opposite each other along a second direction, wherein the first direction is perpendicular to the second direction. The power conversion module includes a primary-side circuit board and a secondary-side module. The secondary-side module includes a secondary-side circuit board, the primary-side circuit board and the secondary-side circuit board are both disposed on the mainboard, such that the primary-side circuit board, the mainboard and the secondary-side circuit board being electrically connected, the primary-side circuit board and the secondary-side circuit board are spatially separated, and the secondary-side circuit board is disposed adjacent to the third side along the first direction, the primary-side circuit board is disposed away from the third side, the secondary-side module further includes a secondary-side element and a first magnetic core element, wherein the secondary-side element and the first magnetic core element are disposed on the secondary-side circuit board along a third direction perpendicular to the first direction and the second direction, the secondary-side element and the first magnetic core element are adjacent to each other, the secondary-side element is disposed adjacent to the mainboard, the first magnetic core element is disposed away from the mainboard, and the first magnetic core element is disposed on the secondary-side circuit board to form a transformer.

In summary, the technical solution provided in the present disclosure optimizes the power path through a reasonable layout of the power device. The technical solution of the present disclosure reduces volumes of magnetic elements and increases the power density of the power supply by adopting a modular circuit design for the power supply. The technical solution of the present disclosure enables the high-density power supply to dissipate heat sufficiently and work stably by optimizing the air passage.

The above description will be described in detail in the following embodiments, and further explanations of the technical solution of the present disclosure will be provided.

BRIEF DESCRIPTION OF THE DRAWINGS

To make above-mentioned and other features, advantages and embodiments of the present disclosure more apparent, the accompanying drawings are described below.

4

Figure 19:
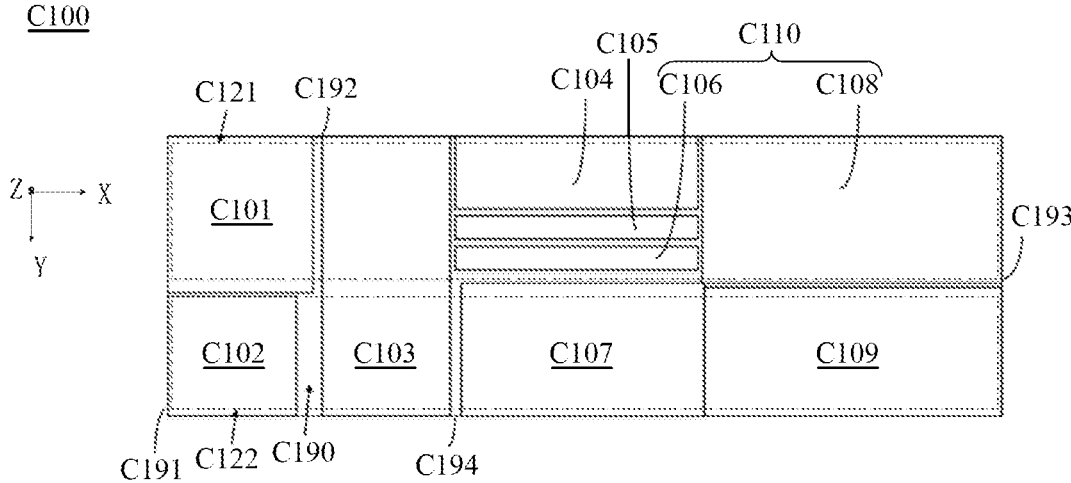
Figure 20:
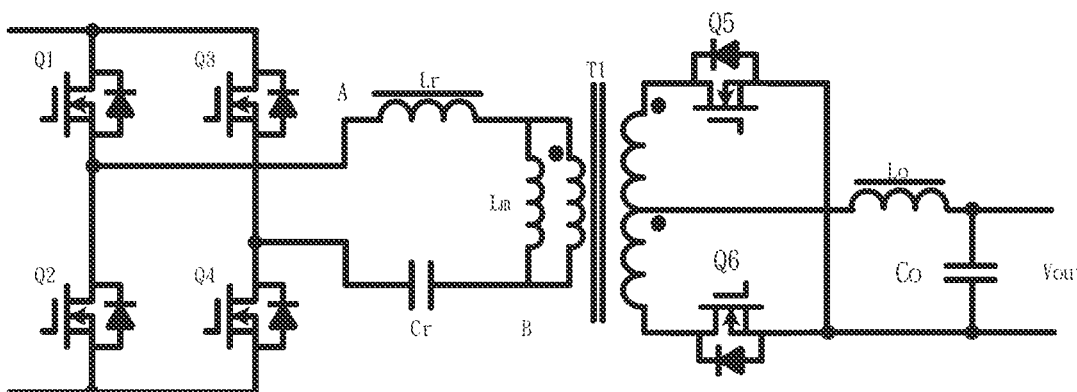
Figure 21:
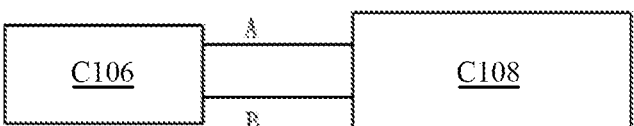
Figure 22:
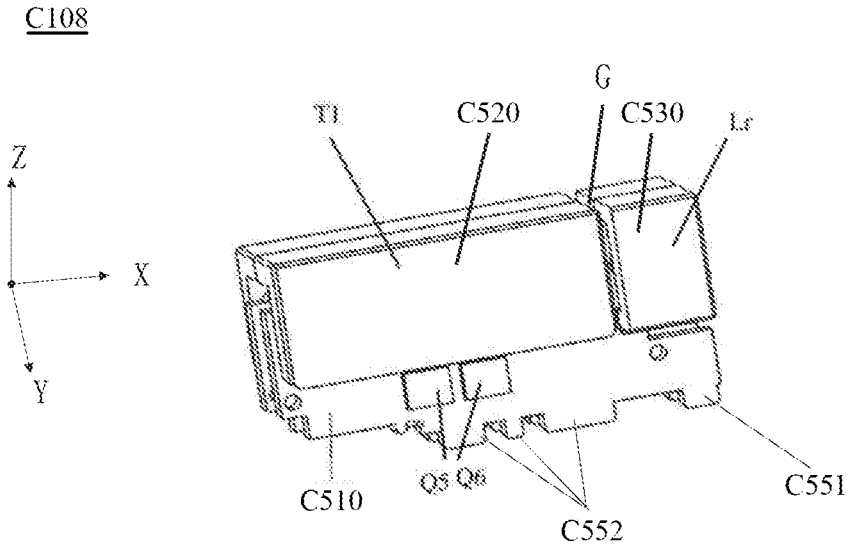
Figure 23:
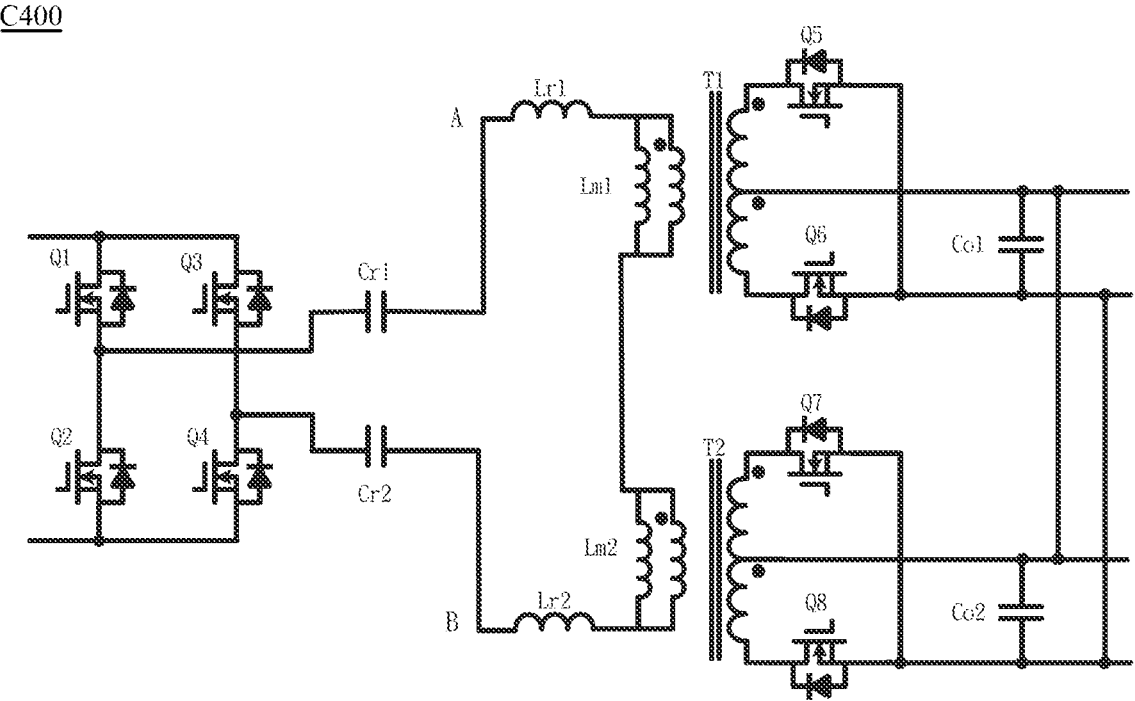
Figure 24:
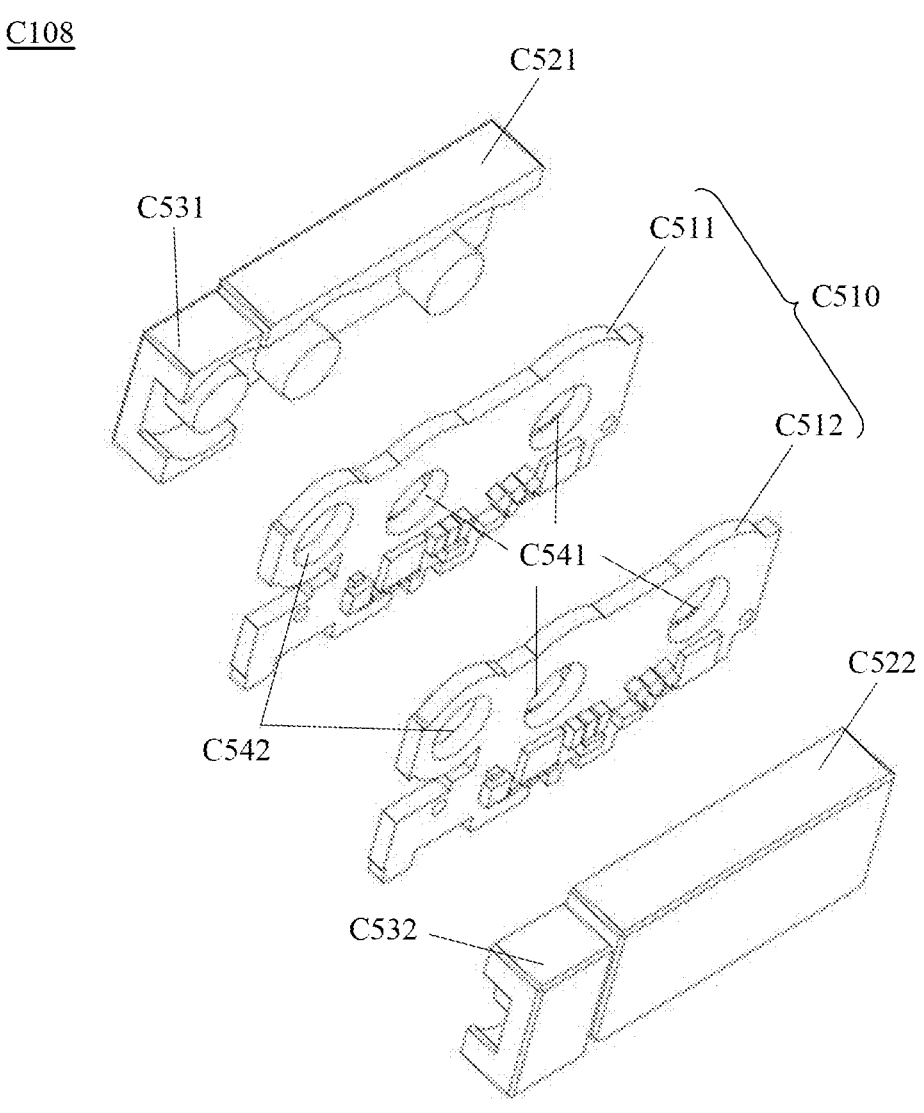
Figure 25:
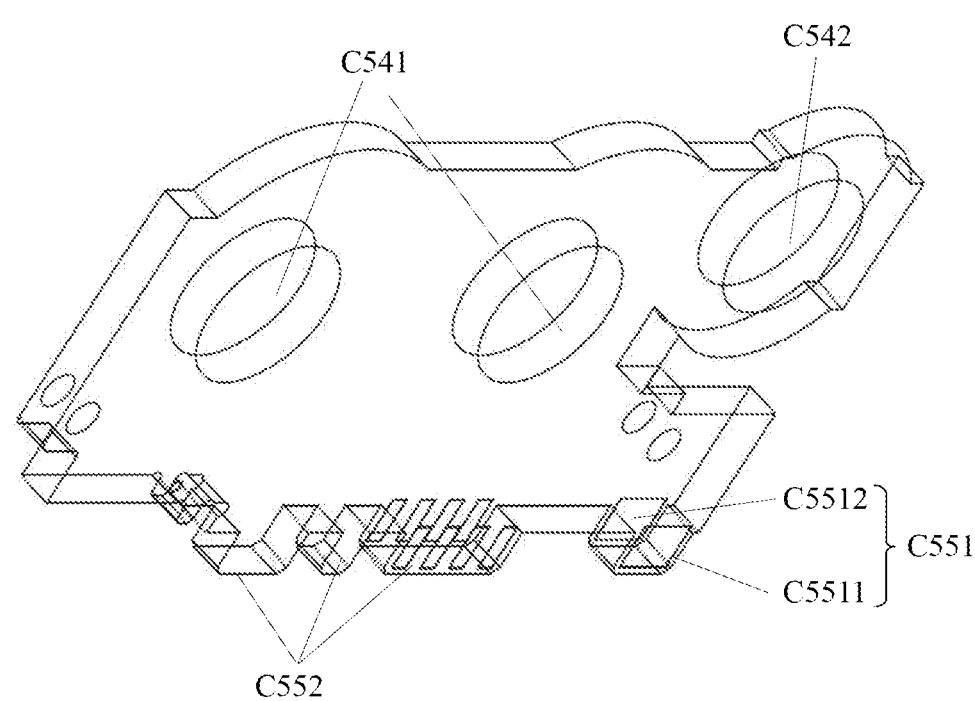

FIG. 19 is a schematic plan view of a power device according to some embodiments of the present disclosure;

FIG. 20 is a circuit diagram of a power conversion circuit according to some embodiments of the present disclosure;

FIG. 21 is a simplified functional diagram of the power conversion circuit in FIG. 20;

FIG. 22 is a perspective view of a secondary-side module according to some embodiments of the present disclosure;

FIG. 23 is a circuit diagram of another power conversion circuit according to some embodiments of the present disclosure;

FIG. 24 is an exploded view of a secondary-side module according to some embodiments of the present disclosure; and FIG. 25 is a schematic diagram of a secondary-side circuit board according to some embodiments of the present disclosure.

DETAILED DESCRIPTION

Reference will now be made in detail to the present embodiments of the disclosure, examples of which are illustrated in the accompanying drawings. The same reference numbers are used in the drawings and the description to refer to the same or like parts. In addition, well-known components and steps are not depicted in embodiments to prevent the present disclosure from unnecessary limitations.

In the present disclosure, unless otherwise clearly stated and limited, the terms "installation", "connection", "coupling", "disposing" and other terms should be explained in a broad sense. For example, it can be a fixed connection or a detachable connection, or integrated into one; it can be directly connected or indirectly connected through an intermediary; it can be an internal connection between two elements or an interaction between two elements. For people having ordinary skill in the art, the specific meanings of the above terms in the present disclosure can be understood according to specific circumstances.

It should be noted that in descriptions of the present disclosure, the terms "first" and "second" are only used to describe different components conveniently and should not be explained as indicating or implying a sequential relationship, relative importance, or implicitly indicating the number of indicated technical features. Therefore, features defined by "first" and "second" may explicitly or implicitly include at least one of these features.

In descriptions of the present disclosure, the terms "an implementation", "some implementations", "an embodiment", "some embodiments", "an exemplary embodiment", "an example", "a specific example", "some examples" or other terms means that a specific feature, structure, material, or characteristic described in connection with an embodiment or example is included in at least one embodiment or example of this application. In the present disclosure, the illustrative description for the aforementioned terms may not indicate the same embodiment or example. Furthermore, the specific features, structures, materials or characteristics described may be combined in any suitable manner in any one or more embodiments or examples.

Figure 1A:
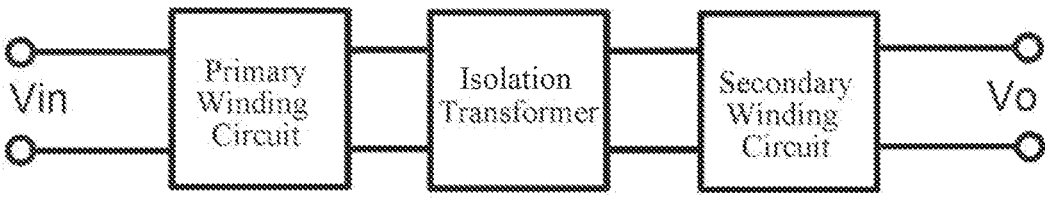
FIG. 1A shows a structural block diagram of a conventional power module.
Figure 1B:
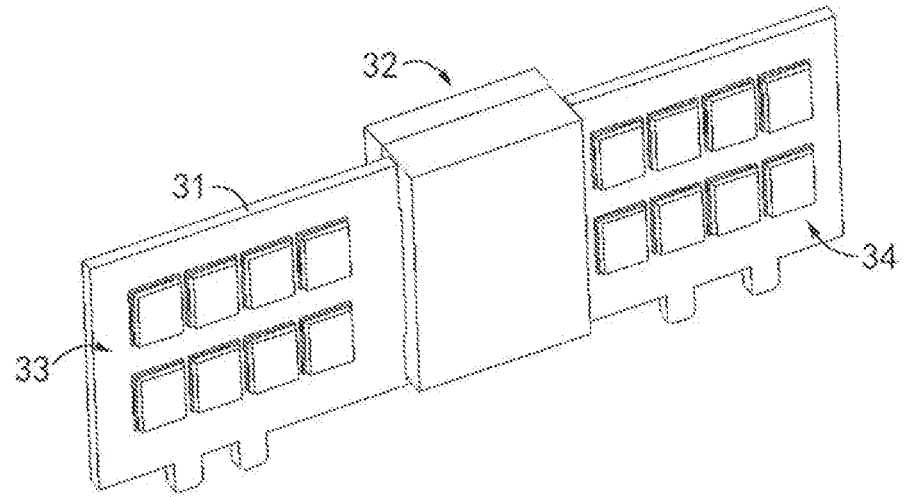
FIG. 1B shows a block diagram of a conventional power module.
Figure 1C:
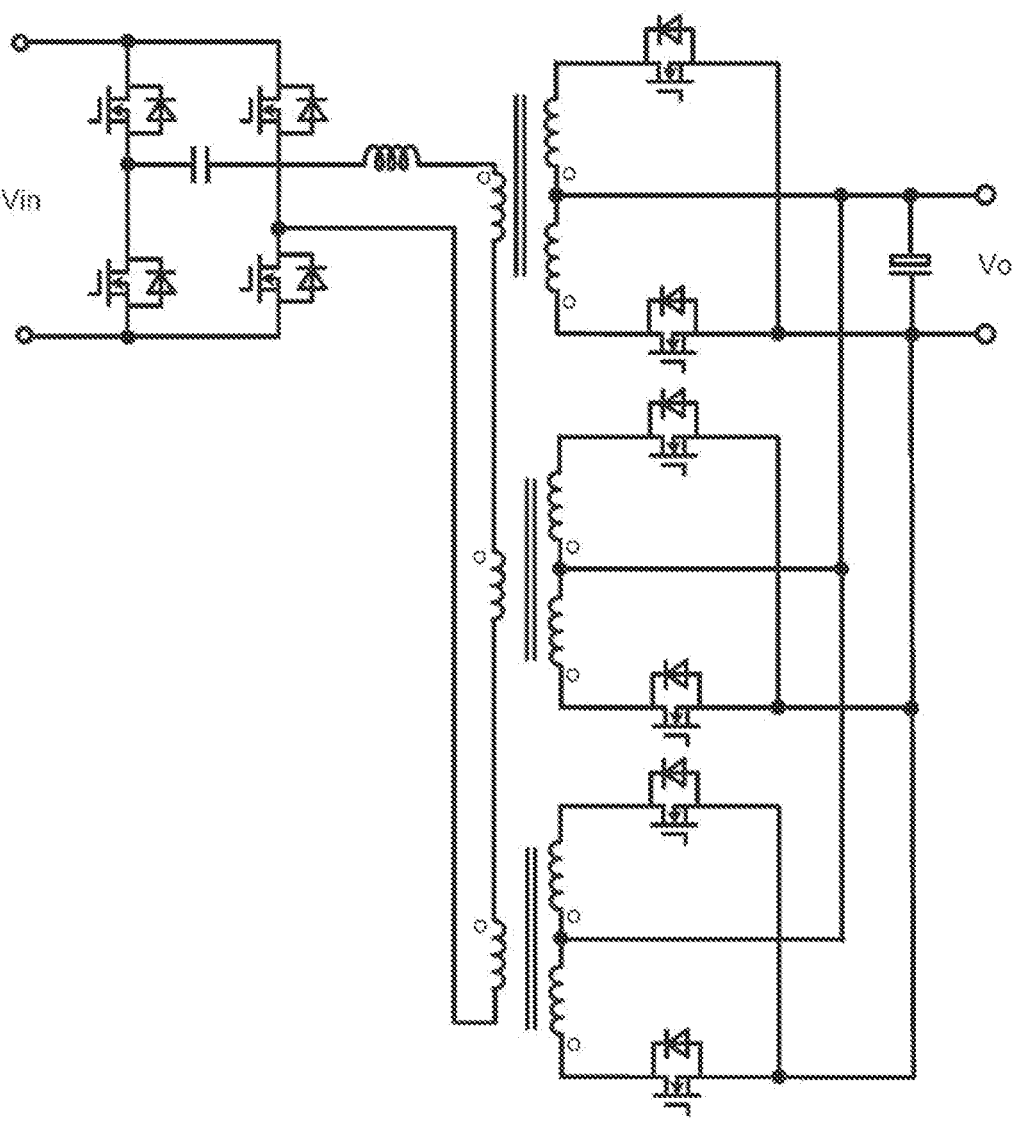
FIG. 1C shows a schematic diagram of a conventional power module, in which a plurality of secondary winding circuits are connected in parallel.
Figure 2:
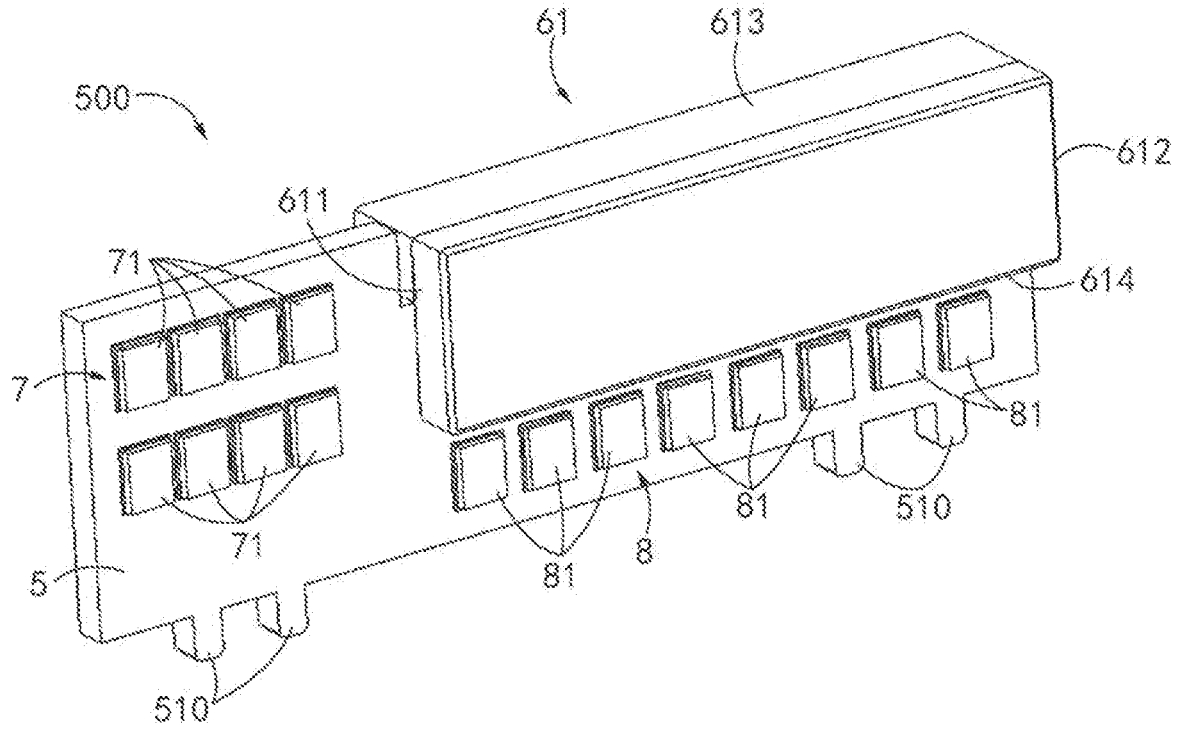
FIG. 2 is a block diagram of the power module according to an exemplary embodiment of the present disclosure.
Figure 3:
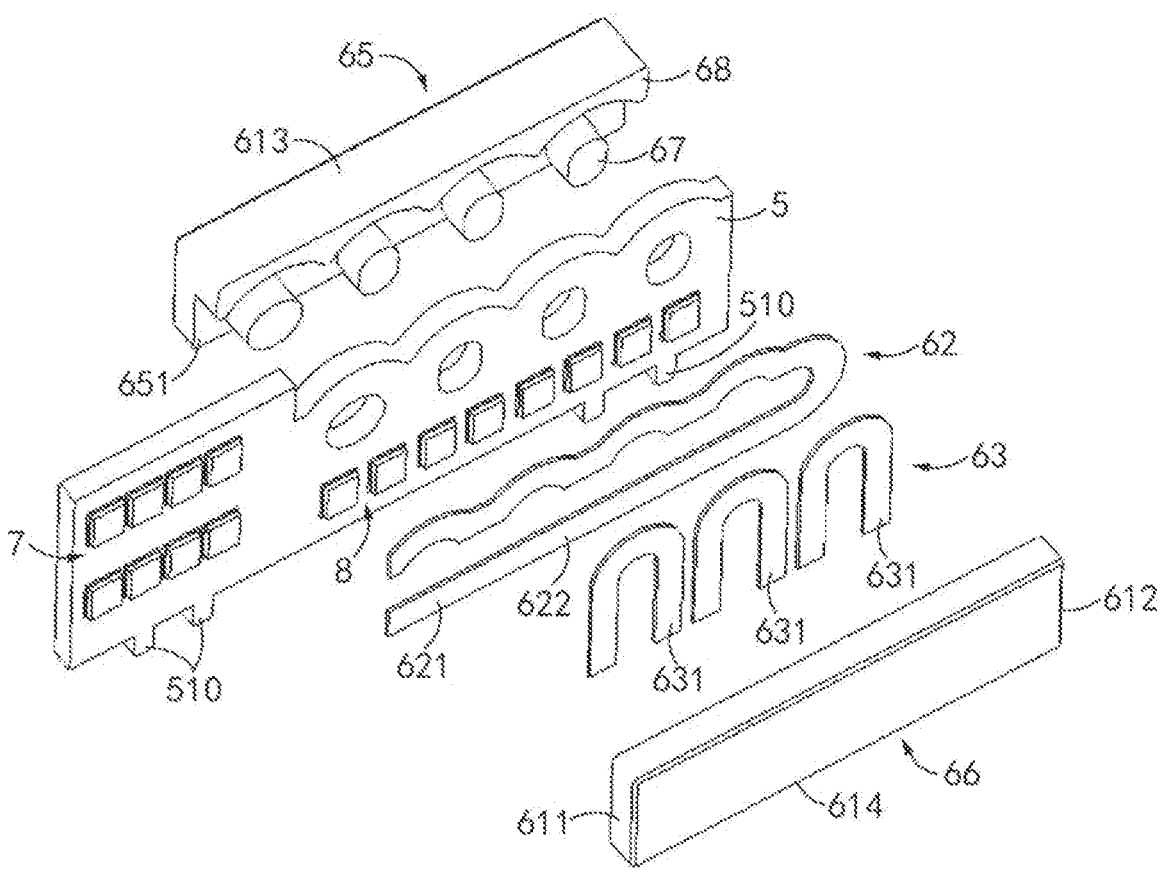
FIG. 3 is an exploded perspective diagram of the power module as shown in FIG. 2.

FIG. 2 is a block diagram of the power module according to an exemplary embodiment of the present disclosure; FIG. 3 is an exploded perspective diagram of the power module as shown in FIG. 2. Referring to FIGS. 2 and 3, a power module 500 includes a PCB 5, a magnetic element, a primary winding circuit 7 and at least one secondary winding circuit 8.

The PCB 5 is divided into two regions, wherein the magnetic element and the secondary winding circuit 8 are provided on one region of the PCB 5, and the primary winding circuit 7 is provided on the other region of the PCB 5. For example, as shown in FIGS. 2, 3, the primary winding circuit 7 is located on left side region of the PCB 5, the magnetic element and secondary winding circuit 8 are located on right side region of the PCB 5, and may be arranged in an upper row and a lower row. Certainly, the present disclosure is not limited thereto, the magnetic element, the primary winding circuit and the secondary winding circuit may also have other arrangements on the PCB.

The magnetic element is provided on the PCB 5 and includes a core structure 61, a primary winding 62 and at least one secondary winding 63.

The core structure 61 of the magnetic element presents in a shape of strip and has a first side 611, a second side 612 opposite to the first side 611, a third side 613 and a fourth side 614 opposite to the third side 613. The third side 613 and the fourth side 614 are connected with the first side 611 and the second side 612, respectively. The first side 611, the second side 612, the third side 613 and the fourth side 614 may together form a shape of rectangle. In addition, the third side 613 and the fourth side 614 may be surfaces extending along the length direction of the core structure 61, respectively.

The primary winding circuit 7 is coupled with the primary winding 62 of the magnetic element. The primary winding circuit 7 is positioned on the PCB 5 in the vicinity of the first side 611 of the core structure 61. In other words, the primary winding circuit 7 is located on left side of the magnetic element.

The secondary winding circuit 8 is coupled with at least one secondary winding 63 of the magnetic element, respectively. The secondary winding circuit 8 is positioned on the PCB 5 in the vicinity of the fourth side 614 of the core structure 61. In other words, the secondary winding circuit 8 is located under the magnetic element.

With the arrangement of the magnetic element, the primary winding circuit 7 and the secondary winding circuit 8 on the PCB 5, the cooling air from the left side of the power module may cool all of the magnetic element, the primary winding circuit 7 and the secondary winding circuit 8 smoothly, so that the power module has an excellent thermal conductivity effect.

It should be noted that the above description of the magnetic element, the primary winding circuit and the secondary winding circuit on the PCB is exemplary, and may not be construed as a limitation of the present disclosure. As should be appreciated by those skilled in the art, the arrangement of the magnetic element, the primary winding circuit and the secondary winding circuit on the PCB may be in other manners. For example, the primary winding circuit 7 is optionally positioned in the vicinity of the first side 611 or the second side 612, and the secondary winding circuit 8 is optionally positioned in the vicinity of the third side 613 or the fourth side 614.

Figure 4:
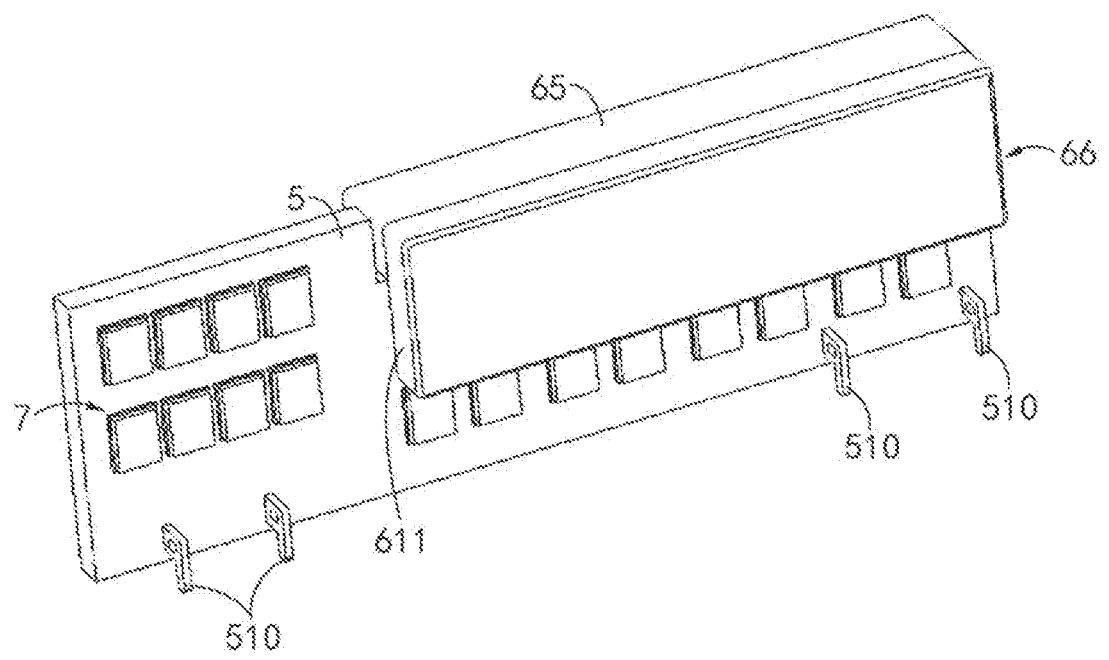
FIG. 4 is a block diagram of the power module according to another exemplary embodiment of the present disclosure.
Figure 5:
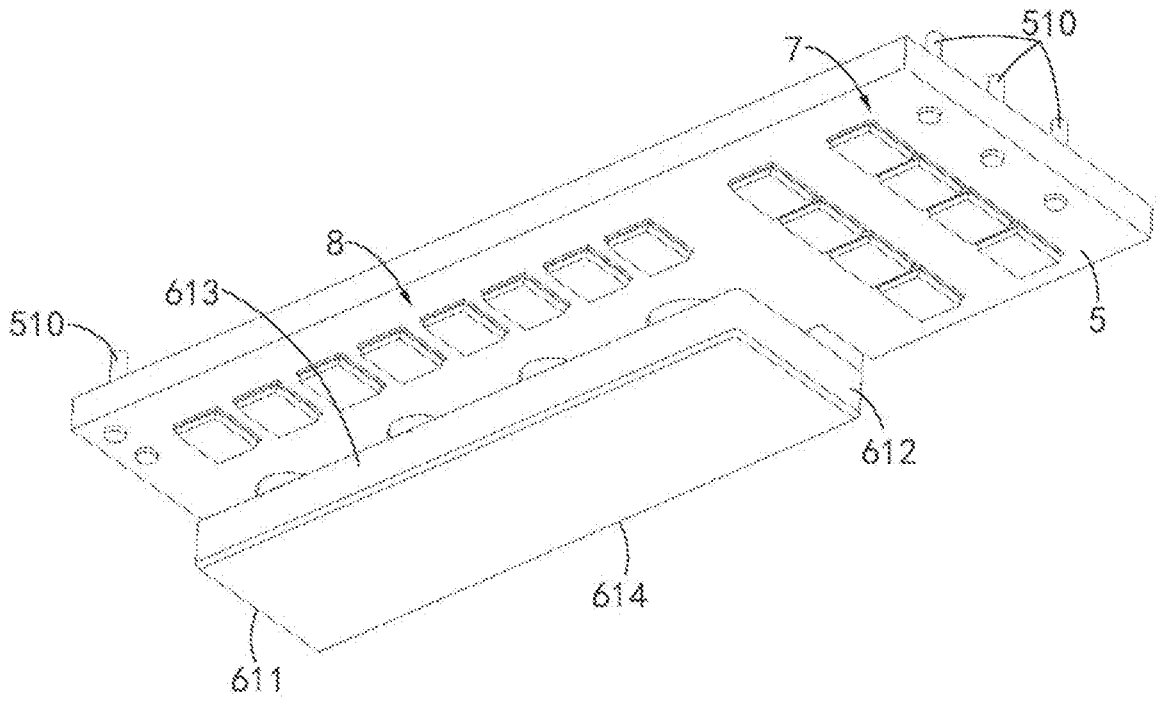
FIG. 5 is a block diagram of the power module according to another exemplary embodiment of the present disclosure.

Besides, the power module further includes pins 510, which are configured to realize the electrical connection and fixation between the power module and the main board. As shown in FIG. 2, the pins 510 are provided under the PCB 5, and the pin 510 may be parallel with the PCB 5, or may be provided on the same surface with the PCB 5. In an embodiment, the pin 510 may be formed by partial PCB of the PCB 5. As shown in FIG. 2, the pins 510 may be electrically connected with the main board via a PCB termination. In another embodiment, the pins 510 may be made of metal material, which electrically connects with the main board using its own metal conductivity characteristic, as shown in FIG. 4. In another embodiment, the pins 510 may be positioned at a place as shown in FIG. 5, the pins 510 may be perpendicular to the PCB 5. However the present disclosure in not limited thereto, the position of the pins 510 may be adjusted according to the actual requirements.

The primary winding circuit 7 may include at least one switch 71, which is in the vicinity of the first side 611 or the second side 612 of the core structure 61. When the primary winding circuit 7 includes a plurality of switches 71, those switches 71 may be arranged in two rows parallel with each other, wherein each row may be arranged along the length direction of the core structure 61 (see FIG. 2). In other embodiments, each row of the switches 71 may be arranged perpendicular to the length direction of the core structure 61 (see FIG. 5). In another embodiment, each row of the switches 71 may form an angle with a length direction of the core structure 61 (not shown in FIGS.). Certainly, the present disclosure is not limited thereto, a plurality of switches 71 forming the primary winding circuit 7 may be arranged in other manners, such as arranging in three rows or four rows, or arranging in a shape of circle, etc.

The secondary winding circuit 8 may include at least one switch 81. When the secondary winding circuit 8 includes a plurality of switches 81, those switches 81 may arranged along the length direction of the core structure 61. As shown in FIG. 2, the switches 81 may be positioned in the vicinity of the fourth side 614 of the core structure 61, that is, the switches 81 may be positioned under the core structure 61. Thus, the lead direction of the secondary winding 63 along the direction from the top to the bottom may be directly and electrically connected with the secondary winding circuit 8 without being bent. Furthermore, because of the significant reduction of the electrical path and trace loss in the secondary winding, the efficiency of the power module and the power device may be improved. Certainly, the present disclosure is not limited thereto, the switches 81 of the secondary winding circuit 8 may be alternatively positioned in the vicinity of the third side 613 (see FIG. 5). The switches 81 forming the secondary winding circuit 8 may not be necessarily arranged in one row along the length direction of the core structure 61. Those switches 81 may also be arranged in other manners. For example, those switches 81 may be arranged in two rows (not shown). Furthermore, the switches 81 in two rows may be in a pair-wise alignment, or in a staggered arrangement, etc.

The arrangement of the switches 71 forming the primary winding circuit 7 and the arrangement of the switches 81 forming the secondary winding circuit 8 may be any combination two-by-two, thus various arrangements may be formed by the core structure 61, the primary winding circuit 7 and the secondary winding circuit 8. The number and connection manners of the primary winding circuit 7 and the secondary winding circuit 8 may not be limited. For example, in some embodiments, the output terminals of the secondary winding circuits 8 may be connected in parallel.

Figure 6:
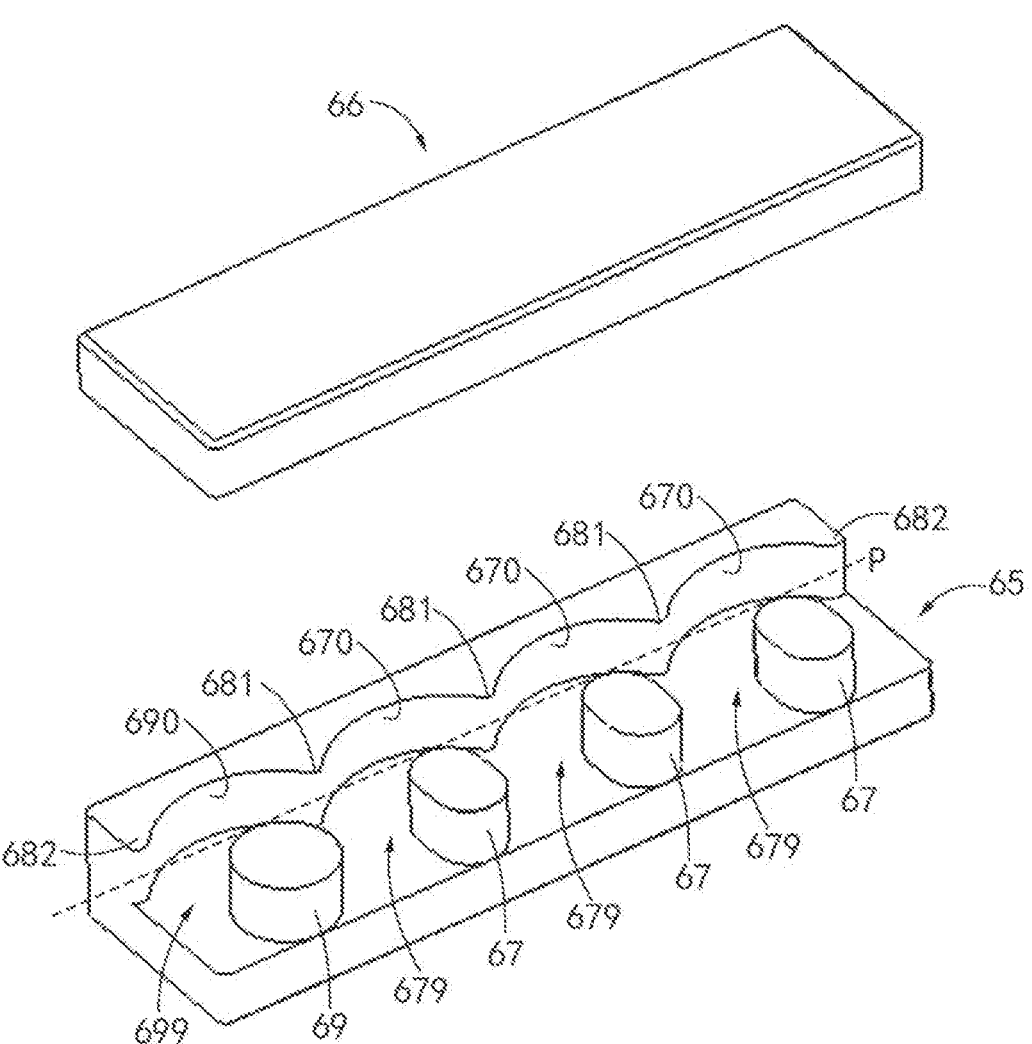
FIG. 6 is an exploded perspective diagram of the core structure of the power module according to an exemplary embodiment of the present disclosure.

FIG. 6 shows the perspective diagram of the core structure 61. Referring to FIGS. 2, 3, 6, the core structure 61 of the magnetic element may include a first magnetic cover 65, a second magnetic cover 66, four winding poles and a common side pole 68. The number of the winding pole may not be limited to four, and the number of the winding poles may be increased or decreased according to factors such as volume size of the core structure 61 in practical application.

The first magnetic cover 65 has a first surface 651, which may assembly with the second magnetic cover 66 (see FIG. 3).

In an exemplary embodiment, all of four winding poles and one common side pole 68 may be formed on the first magnetic cover 65. It will be understood by those skilled in the art that, the present disclosure is not limited thereto. In other exemplary embodiment, the winding poles and the common side pole 68 may also be formed on the second magnetic cover 66; or one of the winding poles and common side pole 68 may be formed on the first magnetic cover 65, and the rest may be formed on the second magnetic cover 66.

The four winding poles may be provided between the first magnetic cover 65 and the second magnetic cover 66, and are located on side of the first surface 651. One or more of the winding poles may be inductor magnetic pole, which may be used for an inductor winding, and other winding poles may be transformer magnetic pole, which may be used to wind a primary winding 62 and secondary winding 63 thereon.

As shown in FIG. 6, one winding pole is an inductor magnetic pole 69, which has a cross-section shape of circle, and the other three winding poles are transformer magnetic pole 67, each of which has a cross-section shape of oval. The transformer magnetic pole 67 and the inductor magnetic pole 69 may have the same cross-section shape or the different cross-section shape.

The common side pole 68 is provided between the first magnetic cover 65 and the second magnetic cover 66, and positioned on the other side of the first surface 651, opposite to the transformer magnetic pole 67 and the inductor magnetic pole 69.

A plurality of first protrusions 681 may be provided on the side surface of the common side pole 68 towards four winding poles, which extend towards the gap formed between the inductor magnetic pole 69 and the transformer magnetic pole 67, respectively. In one embodiment, the first protrusion 681 extends to or beyond a virtual surface P. The virtual surface P is defined as a surface connecting with side walls of the inductor magnetic pole 69 and the transformer magnetic pole 67 towards the common side pole 68. The side surface of the common side pole 68 towards the inductor magnetic pole 69 and the transformer magnetic pole 67 includes four curved surfaces corresponding to the inductor magnetic pole 69 and the transformer magnetic pole 67 respectively. Each of the four curved surfaces protrudes in a direction away from the corresponding winding pole. More specifically, the curved surfaces 690 corresponding to the inductor magnetic pole 69 protrude in a direction away from the inductor magnetic pole 69, and the curved surfaces 670 corresponding to the transformer magnetic pole 67 protrude in a direction away from the transformer magnetic pole 67. That is to say, the curved surface may be partially surrounding the magnetic pole. The first protrusion 681 may be formed at the connection position of four curved surfaces 690, 670. In an embodiment, the first protrusion 681 may support the core so as to maintain the air gap of the inductor or the transformer stable and to keep consistent inductance value.

The curved surface of the common side pole 68 has a projection on the first magnetic cover 65, and the projection presents a shape of circular, partial elliptical or partial runway. As shown in FIG. 6, four curved surfaces 690, 670 of the common side pole 68 have the same shape. In other embodiment, multiple curved surfaces of the common side pole 68 may be various.

In an embodiment, the curved surface of the common side pole 68 has a shape corresponding to that of the winding pole, for example, the inductor magnetic pole 69 has a cross-section of circle, and accordingly the curved surface 690 of the inductor magnetic pole 69 has a shape of partial circular arc (see FIG. 6); The transformer magnetic pole 67 has a cross-section of oval, and accordingly the curved surface 670 of the transformer magnetic pole 67 has a shape of circular arc surface. However the present disclosure is not limited thereto, the curved surface of the common side pole 68 may has a shape not compatible with that of cross-section of the winding pole. For example, the winding pole has a cross-section of circular, while the curved surface has a shape of runway.

A holding space 699 is defined between the curved surface 690 of the common side pole 68 and corresponding inductor magnetic pole 69, which may use for disposing the inductor winding; A holding space 679 is defined between the curved surface 670 of the common side pole 68 corresponding transformer magnetic pole 67, which may be used for disposing the transformer winding.

In other embodiment, second protrusions 682 are provided at two ends of the common side pole 68 respectively. And the second protrusions 682 may be corresponding to two ends of the first magnetic cover 65 and may extend along the same direction as that of the first protrusion 681.

In an embodiment as shown in FIG. 6, the first magnetic cover 65, the inductor magnetic pole 69, the transformer magnetic pole 67 and the common side pole 68 may collectively constitute a special E-type magnetic core, and the second magnetic cover 66 may be an I-type magnetic core, thus forming an EI-type core structure by assembling the first magnetic cover 65 and the second magnetic cover 66. It is to be appreciated that the core structure according to present disclosure is not limited to EI-type core structure. For example, the core structure may also be an EE-type core structure and so on.

The structure of the magnetic element will be briefly described combining the inductor winding 621, the primary winding 622 and the secondary winding 63 as follows.

Figure 7:
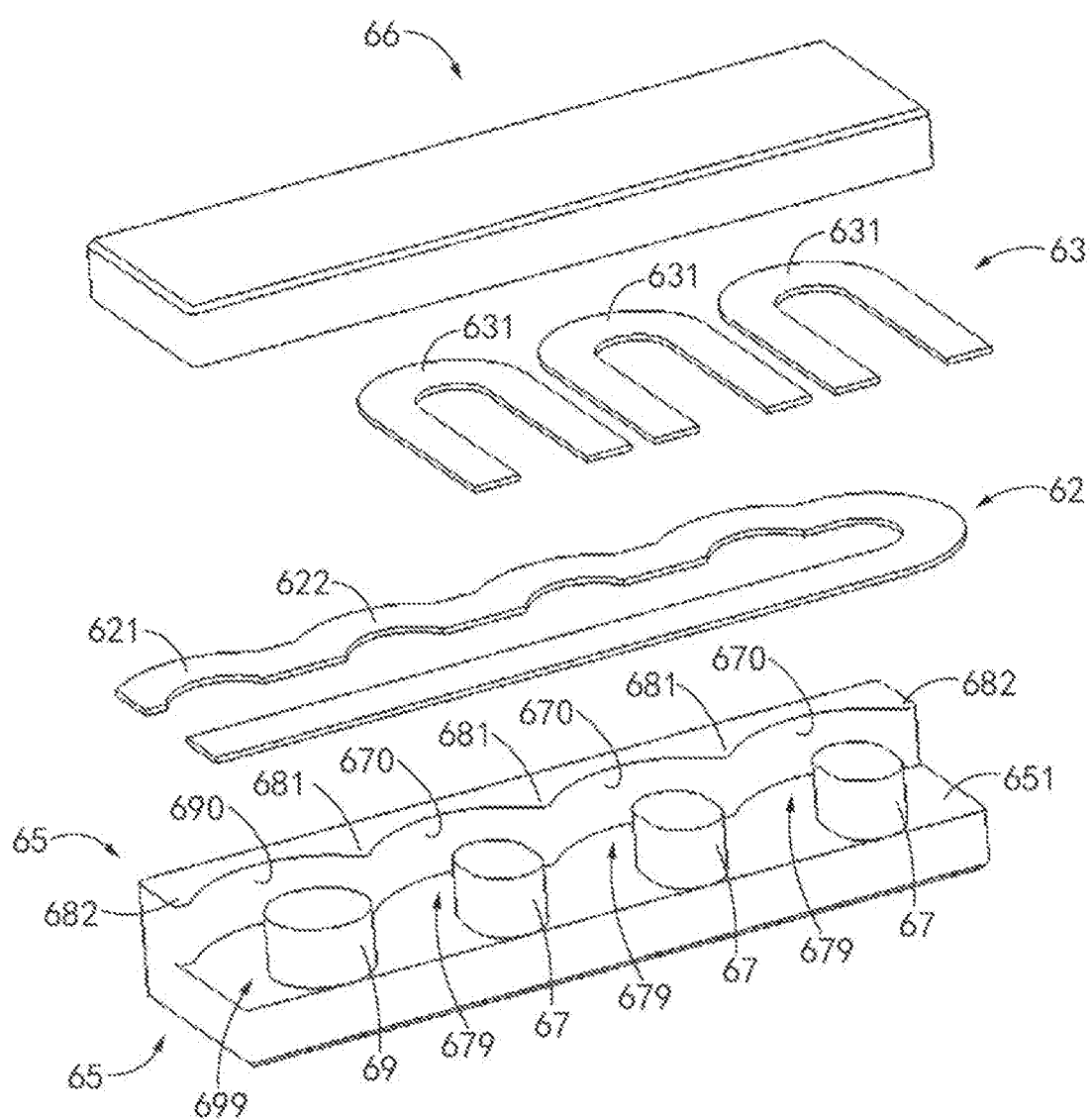
FIG. 7 is an exploded perspective diagram of the magnetic element of the power module according to an exemplary embodiment of the present disclosure.

FIG. 7 is an exploded perspective diagram of the magnetic element of the power module, which shows the winding manner of the primary winding 622 and secondary winding 63 on the transformer magnetic pole 67. As shown in FIGS. 3, 7, the inductor winding 621 and primary winding 622 may be formed totally by one piece of wire, which may wound around four winding poles, that is, the wire may encircle all of the winding poles. A part of the wire corresponding to the inductor magnetic pole 69 may form the inductor winding 621, and other part of the wire corresponding to the transformer magnetic pole 67 may form the transformer winding 622. The lead direction of the wire formed the inductor winding 621 and the primary winding 622 may be along the arrangement direction of four transformer magnetic poles 67, that is, along the length direction of the core structure 61. It is very convenient for the wire directly extending from the first side 611 of the core structure 61. Referring to FIG. 3, under such condition, and the outgoing trace of the primary winding 622 may be coupled with the primary winding circuit 7 which is positioned in the vicinity of the first side 611. Thus, the electrical path between the primary winding 622 and the primary winding circuit 7 may be relatively short. The previous description of the primary winding 622 and its lead direction may be exemplary and not limited to present disclosure.

The winding 63 may include three pieces of wire sections 631, each of which is wounded around one of the transformer magnetic poles 67. The lead direction of the three wire sections may be far away from the common side pole 68, and may be perpendicular to the length of the common side pole 68. In present exemplary embodiment, the length direction of the common side pole 68 may be coincident with the length direction of the core structure 61. Referring to FIG. 3, the outgoing traces of the three wire sections 631 of the secondary winding 63 (the outgoing traces of the secondary winding 63) may directly extend from the fourth side 614 of the core structure 61, which is very convenient. The outgoing traces of the secondary winding 63 may be in the vicinity of the secondary winding circuit 8, and the pins 510 of the PCB 5 may be positioned under the core structure 61 and may be in the vicinity of the secondary winding circuit 8. Therefore, the electrical path may be shortened and trace loss of the secondary winding circuit may be reduced according to the present disclosure.

The previous description of the primary winding 622, the secondary winding 63 and their outgoing traces are exemplary rather than a limiting to present disclosure. The secondary winding 63 may be other structure. For example, the secondary winding 63 may include two, four or more section wires, or the secondary winding 63 may be formed by conductive sheet. The lead direction of the outgoing traces of the three wire sections may form an angle of 45°~135° with the length direction of the common side pole 68 such as 45°, 60°, 100°, 120°, 135°, etc.

The wire of the primary winding 622 or the wire of the secondary winding 63 may be an enameled-wire or a PCB winding formed in the PCB 5.

Figure 8:
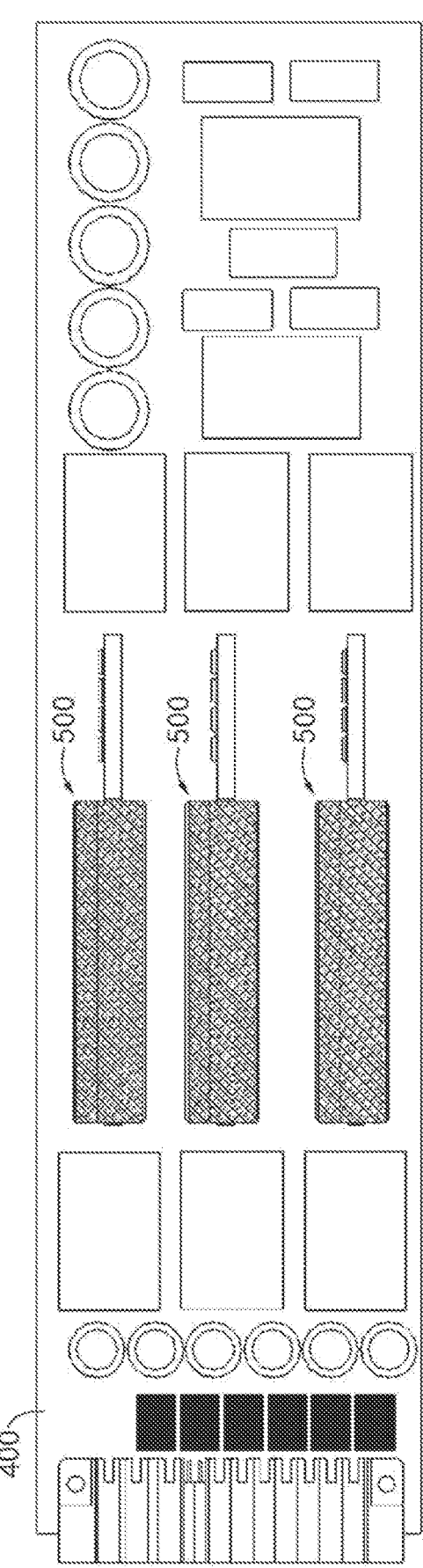
FIG. 8 is a block diagram of the power device according to an exemplary embodiment of the present disclosure.

Referring to FIG. 8, FIG. 8 is a block diagram of the power device according to an exemplary embodiment of the present disclosure. As shown in FIG. 8, the power device may include a main board 400 and at least one power module 500. The main power semiconductor component of the power device may be integrated together into the power module 500. FIG. 8 shows three power modules 500. However, the number of the power modules 500 may increase or decrease according to actual requirement. In the present embodiment, the power module 500 may be a power module as shown in FIG. 2. The power module 500 has a plurality of pins 510, which may be parallel with the PCB (referring to FIG. 2). The main board 400 is provided with holes (not shown) for which the pins 510 may insert in. The power module 500 may achieve electrical connection and fixation with the main board 400 via the pins 510 and the holes.

Figure 9:
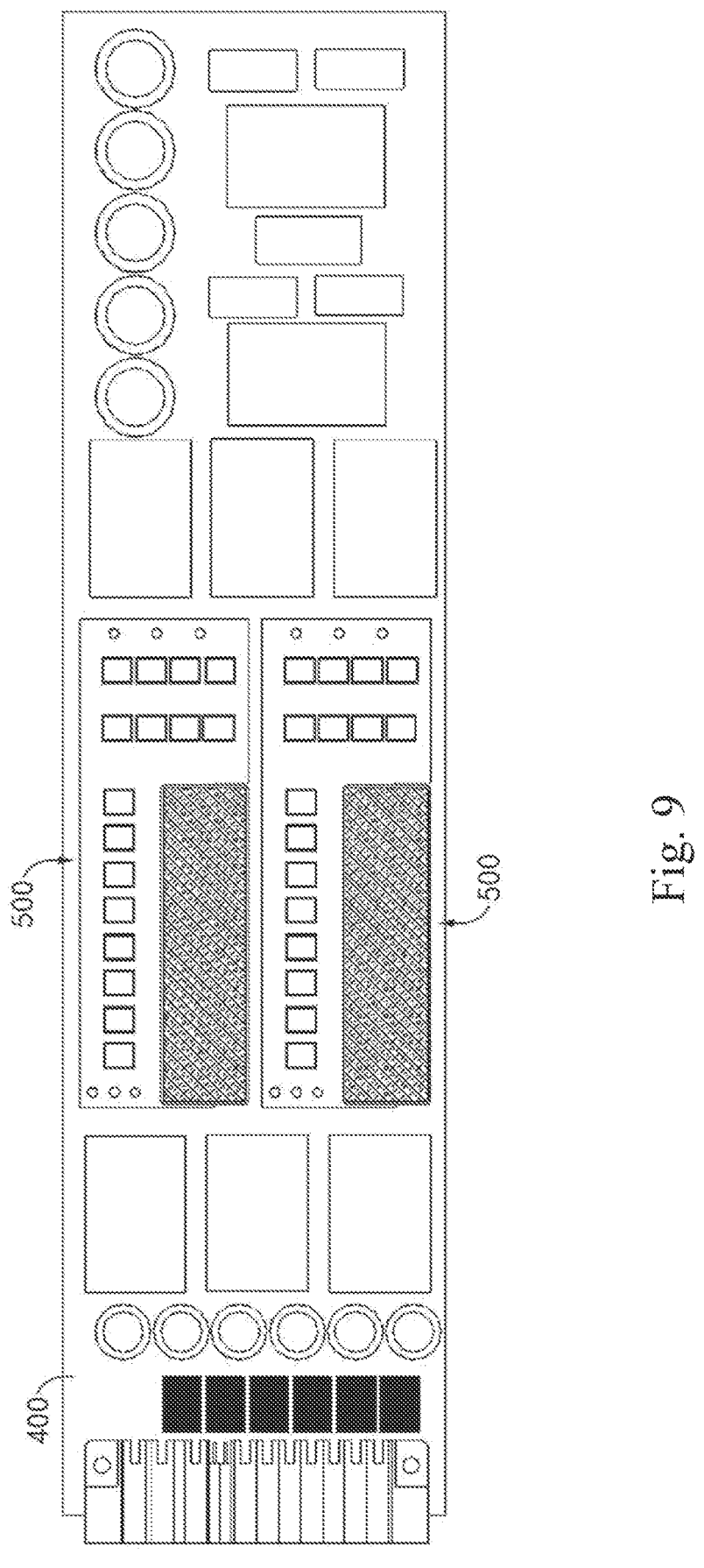
FIG. 9 is a block diagram of the power device according to another exemplary embodiment of the present disclosure.

Referring to FIG. 9, FIG. 9 is a block diagram of the power device according to another exemplary embodiment. As shown in FIG. 9, the power device may include a main board 400 and at least one power module 500. The main power semiconductor component of the power device may be integrated together into the power module 500. FIG. 9 shows two power modules 500. However, the number of the power modules 500 may increase or decrease according to actual requirement. In the present embodiment, the power module 500 may be a power module as shown in FIG. 5. The power module 500 has a plurality of pins 510, which may be perpendicular to the PCB (Referring to FIG. 4). The main board 400 is provided with holes (not shown) for which the pins 510 may insert in. The power module 500 may achieve electrical connection and fixation with the main board 400 via the pins 510 and the holes.

It should be understood that the previous description of the pins may be formed by partial PCB of the PCB. The pins may be a metal pin, but the present disclosure is not limited thereto, determination may depend upon actual requirement.

In the present power module, the core structure of the magnetic element has a first side and a second side opposite to each other, and a third side and a fourth side opposite to each other. The primary winding circuit is positioned in the vicinity of the first side or the second side, the secondary winding circuit is positioned in the vicinity of the third side or the fourth side. That is, the primary winding circuit and the secondary winding circuit are each positioned in the vicinity of two adjacent sides of the core structure, such arrangement is suitable for an architecture that the primary windings are connected in series and the secondary windings are connected in parallel.

The lead direction of the secondary winding in this magnetic element may be easily designed to be oriented towards the secondary winding circuit, which may be directly connected with the secondary winding circuit without being bent, resulting in a significant reduction of the electrical path and trace loss in the secondary winding, thereby the efficiency of the power module and the power device may be improved.

Because the primary winding circuit and the secondary winding circuit are each positioned in the vicinity of two adjacent sides of the core structure, and the core structure does not obstruct the secondary winding circuit, thus the cooling air can cool all of the primary winding circuit, the secondary winding circuit and the magnetic element, and the cooling blind corner may be avoided. Therefore, the power module and the power device according to present disclosure have an excellent thermal conductivity effect.

Figure 10:
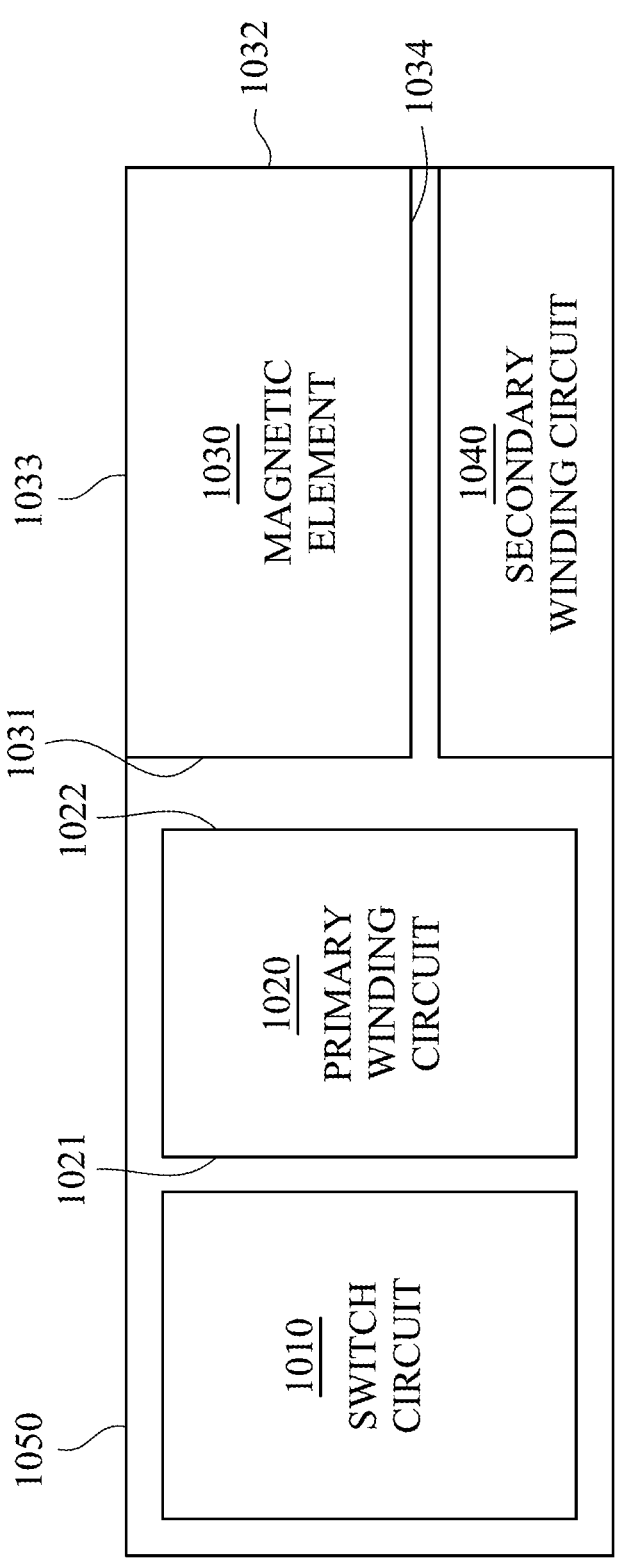
FIG. 10 is a block diagram of a power module according to an exemplary embodiment of the present disclosure.
Figure 10:
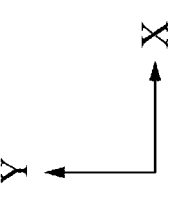

FIG. 10 is a block diagram of a power module 1000 according to an exemplary embodiment of the present disclosure. The power module 1000 is similar with the power module 500 shown in FIG. 5.

As illustratively shown in FIG. 10, the power module 1000 includes a primary winding circuit 1020, a magnetic element 1030, a secondary winding circuit 1040 and a PCB 1050. The primary winding circuit 1020, the secondary winding circuit 1040 and the PCB 1050 correspond to the primary winding circuit 7, the secondary winding circuit 8 and the PCB 5 shown in FIG. 2, respectively. The magnetic element 1030 corresponds to the magnetic element, the core structure 61, the primary winding 62 and the secondary winding 63 shown in FIG. 2.

As illustratively shown in FIG. 10, a difference between the power module 1000 and the power module 500 is that the power module 1000 further includes a switch circuit 1010. In some embodiments, the switch circuit 1010 is coupled to the primary winding circuit 1020. In some embodiments, the switch circuit 1010 is included in a regulator.

The circuit of the regulator can be a boost circuit or a PFC circuit. The boost circuits 1210 and 1300A-1300C are shown in FIGS. 12, 13A-13C, and the Totem PFC circuits 1300D-1300G are shown in FIGS. 13D-13G. However, the boost circuits or the PFC circuits are not limited to those shown in FIGS. 13A-13G, and can be varied according to the actual operation.

In some embodiments, the switch circuit 1010 includes at least one switch, for example, one of switches S121, S13A1, S13A2, S13B1, S13B2, S13C1-S13C4, S13D1, 513D2, S13E1-513E4, S13F1-513F4, S13G1-S13G6, and diodes D121, D13A1, D13A2, D13D1, D13D2, D13F1, D13F2 shown in FIGS. 12, 13A-13G.

As illustratively shown in FIG. 10, the switch circuit 1010, the primary winding circuit 1020, the magnetic element 1030 and the secondary winding circuit 1040 are disposed on the PCB 1050.

As illustratively shown in FIG. 10, the magnetic element 1030 includes four sides 1031-1034. The side 1031 is opposite to the side 1032. The side 1033 is opposite to the side 1034. The primary winding circuit 1020 includes two sides 1021 and 1022. The side 1021 is opposite to the side 1022.

As illustratively shown in FIG. 10, the primary winding circuit 1020 is positioned in a vicinity of the side 1031. The secondary winding circuit 1040 is positioned in a vicinity of the side 1034. The switch circuit 1010 is positioned in a vicinity of the side 1021. The magnetic element 1030 is positioned in a vicinity of the side 1022. In other words, the switch circuit 1010 and the magnetic element 1030 are positioned in two vicinities of two opposite sides 1021 and 1022 of the primary winding circuit 1020, respectively.

Figure 11:
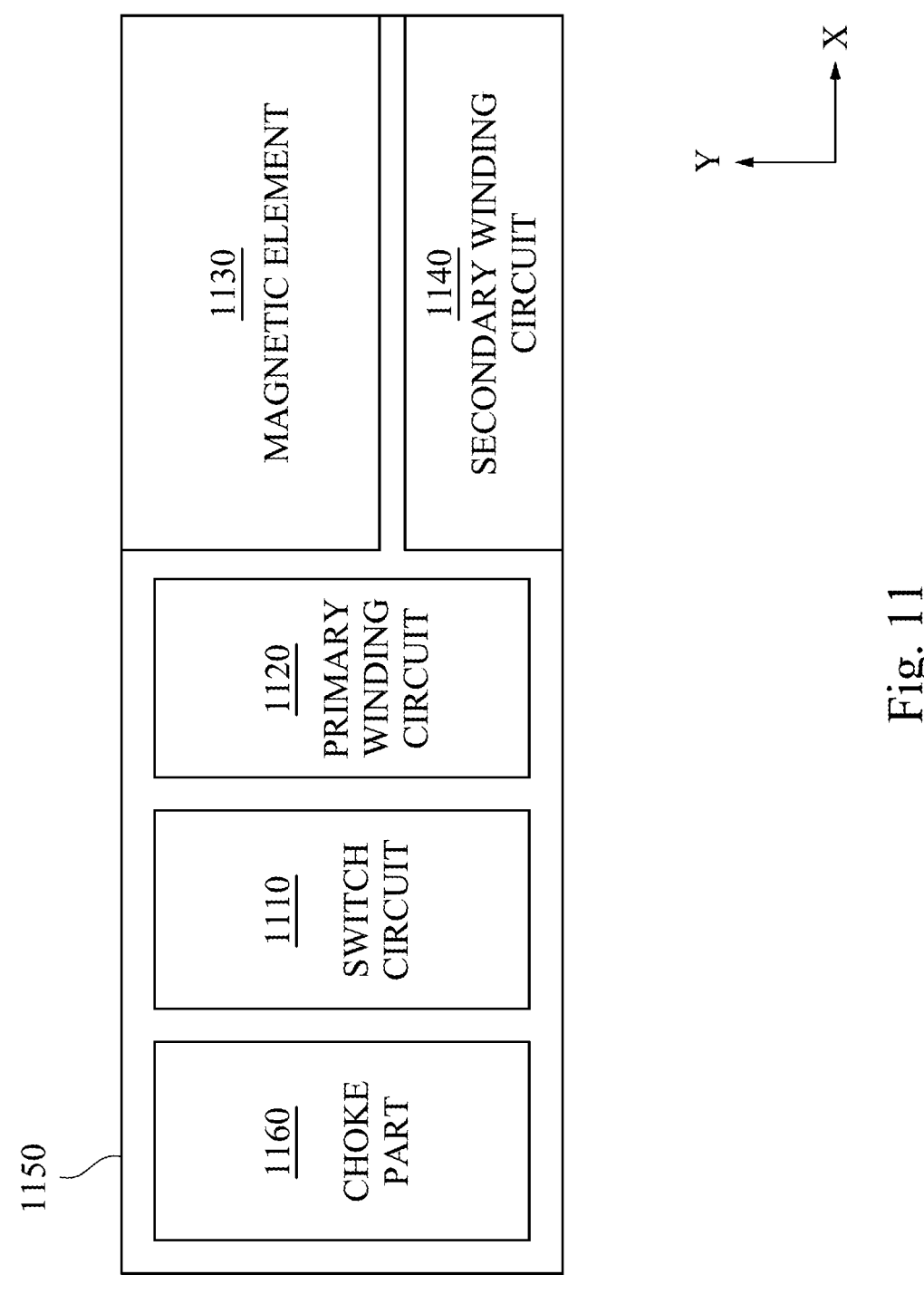
FIG. 11 is a block diagram of a power module according to an exemplary embodiment of the present disclosure.

FIG. 11 is a block diagram of a power module 1100 according to an exemplary embodiment of the present disclosure. The power module 1100 is similar with the power module 1000 shown in FIG. 10. FIG. 11 follows a similar labeling convention to that of FIG. 10. For brevity, the discussion will focus more on differences between FIG. 10 and FIG. 11 than on similarities.

As illustratively shown in FIG. 11, the power module 1100 includes a switch circuit 1110, a primary winding circuit 1120, a magnetic element 1130, a secondary winding circuit 1140 and a PCB 1150. The switch circuit 1110, the primary winding circuit 1120, the magnetic element 1130, the secondary winding circuit 1140 and the PCB 1150 correspond to the switch circuit 1010, the primary winding circuit 1020, the magnetic element 1030, the secondary winding circuit 1040 and the PCB 1050 shown in FIG. 10, respectively.

As illustratively shown in FIG. 11, a difference between the power module 1100 and the power module 1000 is that the power module 1100 further includes a choke part 1160. In some embodiments, the choke part 1160 is coupled to the switch circuit 1110. In some embodiments, the choke part 1160 is included in the regulator. In some embodiments, the choke part 1160 includes at least one choke, for example, one of chokes L121, L13A1, L13A2, L13B1, L13C1, L13C2, L13D1, L13E1, L13F1, L13F2, L13G1 and L13G2 shown in FIGS. 12, 13A-13G. In some embodiments, the choke part 1160 and the switch circuit 1110 are configured to operate as a regulator circuit, for example, the boost circuit or the PFC circuit.

As illustratively shown in FIG. 11, the switch circuit 1110, the primary winding circuit 1120, the magnetic element 1130, the secondary winding circuit 1140 and the choke part 1160 are disposed on the PCB 1150. The choke part 1160, the switch circuit 1110 and the primary winding circuit 1120 are arranged in a first direction (e.g., X-direction shown in FIG. 11) in order. In some embodiments, the first direction is a longitudinal direction of the PCB 1150. In other embodiment, the first direction corresponds to a direction from one side of the magnetic element including the primary winding circuit to the opposite side of the magnetic element.

Figure 12:
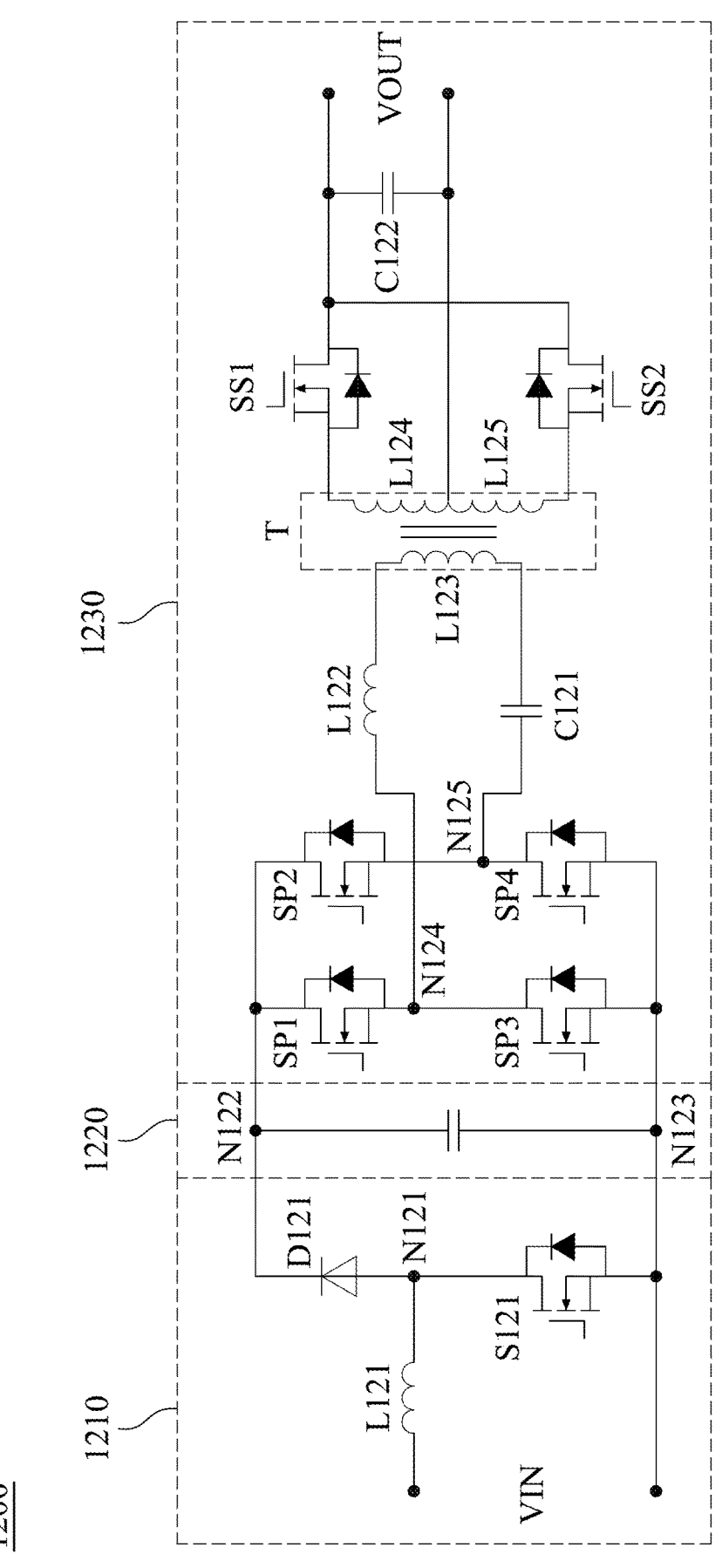
FIG. 12 is a schematic diagram representing the main power circuit of a power device according to an exemplary embodiment of the present disclosure.

FIG. 12 is a schematic diagram representing the main power circuit of a power device according to an exemplary embodiment of the present disclosure. In some embodiments, the schematic diagram 1200 is configured to convert a voltage VIN to a voltage VOUT. In FIG. 12, the voltage VIN is, but not limited to, a DC voltage. In some embodiment, the voltage VIN is an AC voltage.

As illustratively shown in FIG. 12, the schematic diagram 1200 includes a regulator circuit 1210, a bulk capacitor 1220 and a DC/DC converter 1230. In various embodiments, the boost 1210 is implemented by the switch circuits 1110, 1010 and the choke part 1160 shown in FIGS. 10-11. The DC-DC converter 1230 is implemented by one or more of the primary winding circuits 7, 1020, 1120, the magnetic elements 1030, 1130 and the secondary winding circuits 8, 1040, 1140.

As illustratively shown in FIG. 12, the bulk capacitor 1220 is coupled in parallel with the regulator circuit 1210 and the DC-DC converter 1230. The regulator circuit 1210 is configured to receive the voltage VIN. The DC-DC converter 1230 is configured to output the voltage VOUT.

As illustratively shown in FIG. 12, the regulator circuit 1210 is a boost circuit and includes a switch S121, a choke L121 and a diode D121. The switch S121 is coupled to the choke L121 and the diode D121 at a node N121. The diode D121 and the switch S121 are coupled to the DC-DC converter 1230 at nodes N122 and N123, respectively.

In various embodiments, the switch S121 is included in the switch circuit 1010 or the switch circuit 1110 shown in FIG. 10 or 11. In some embodiments, the choke L121 is included in the choke part 1160 shown in FIG. 11.

As illustratively shown in FIG. 12, DC-DC converter 1230 includes switches SP1-SP4, SS1, SS2, inductor L122, transformer T and capacitors C121, C122. The switches SP1 and SP2 are coupled to the regulator circuit 1210 and the bulk capacitor 1220 at the node N122. The switches SP3 and SP4 are coupled to the regulator circuit 1210 and the bulk capacitor 1220 at the node N123.

In various embodiments, the switches SP1-SP4 are included in the primary winding circuits 7, 1020 or 1120 shown in FIG. 2, 10 or 11.

As illustratively shown in FIG. 12, the inductor L122, the primary winding of the transformer T and the capacitor C121 are coupled in series. The inductor L122 is coupled to the switches SP3 and SP1 at a node N124. The capacitor C121 is coupled to the switches SP2 and SP4 at a node N125. The secondary winding of the transformer T and the switches SS1, SS2 are coupled in series.

In some embodiments, the inductor L122 and the capacitor C121 are configured to operate as a resonant circuit. The inductor L122 is configured to operate as a resonant inductor of the resonant circuit.

In various embodiments, the inductor L122 and the transformer T are included in the magnetic elements 1030 or 1130 shown in FIG. 10 or 11. The switches SS1, SS2 are included in the secondary winding circuits 8, 1040 or 1140 shown in FIG. 2, 10 or 11.

Figure 13A:
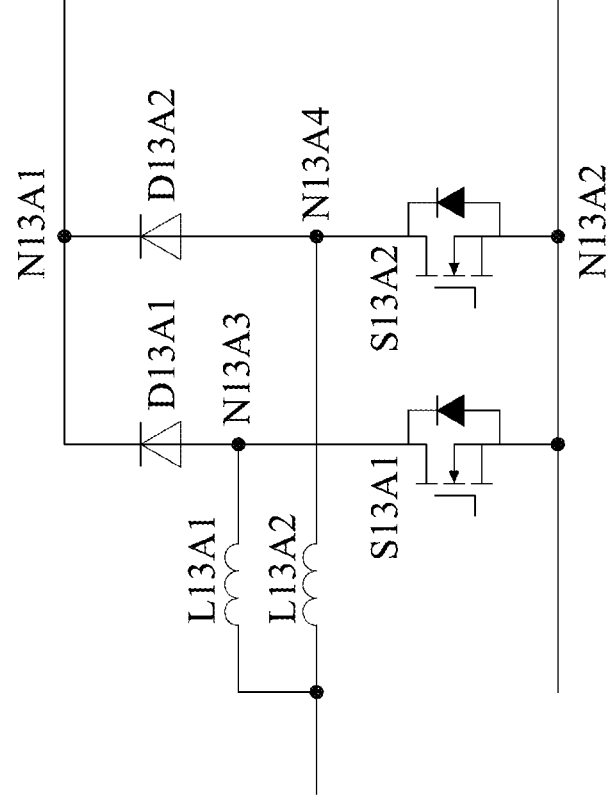
FIGS. 13A-13G are circuit diagrams of different regulator circuits according to an exemplary embodiment of the present disclosure.

FIG. 13A is another circuit diagram of a regulator circuit 1300A according to an exemplary embodiment of the present disclosure. The regulator circuit 1300A is an alternative of the regulator circuit 1210 shown in FIG. 12. In some embodiments, the regulator circuit 1300A is coupled to the DC-DC converter 1230 at nodes N13A1 and N13A2. In some embodiments, the nodes N13A1 and N13A2 are coupled to the nodes N122 and N123, respectively.

As illustratively shown in FIG. 13A, the regulator circuit 1300A is the boost circuit and includes switches S13A1, S13A2, chokes L13A1, L13A2 and diodes D13A1, D13A2. The switches S13A1 and S13A2 are coupled to each other at the node N13A2. The diodes D13A1 and D13A2 are coupled to each other at the node N13A1. The chokes L13A1, L13A2 are coupled in series. The choke L13A1 is coupled to the switch S13A1 and the diode D13A1 at a node N13A3. The choke L13A2 is coupled to the switch S13A2 and the diode D13A2 at a node N13A4.

In various embodiments, the switches S13A1 and S13A2 are included in the switch circuit 1010 or the switch circuit 1110 shown in FIG. 10 or 11. In some embodiments, the chokes L13A1 and L13A2 are included in the choke part 1160 shown in FIG. 11.

Figure 13C:
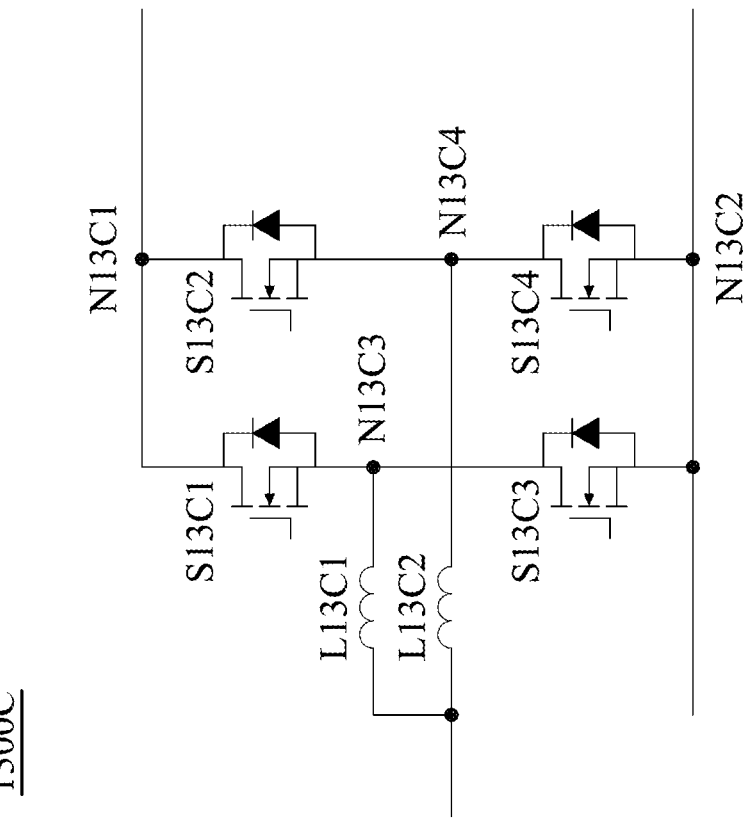
Figure 13B:
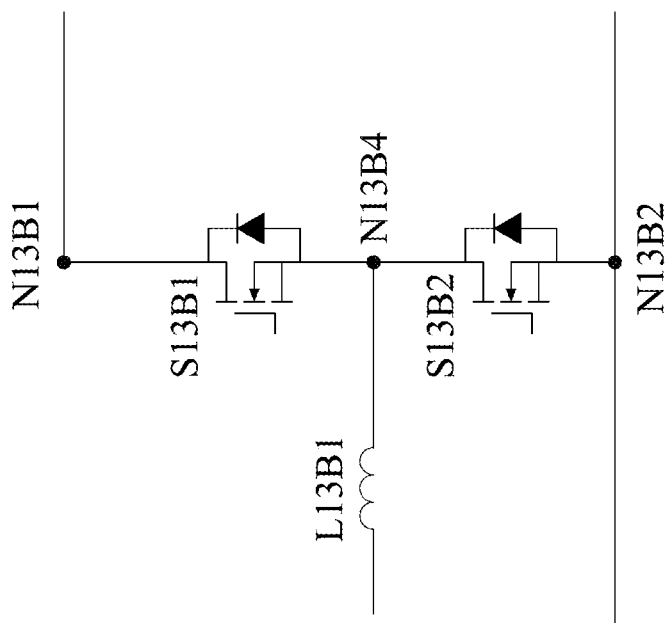
Figures 13D, 13E, 13F, 13G:
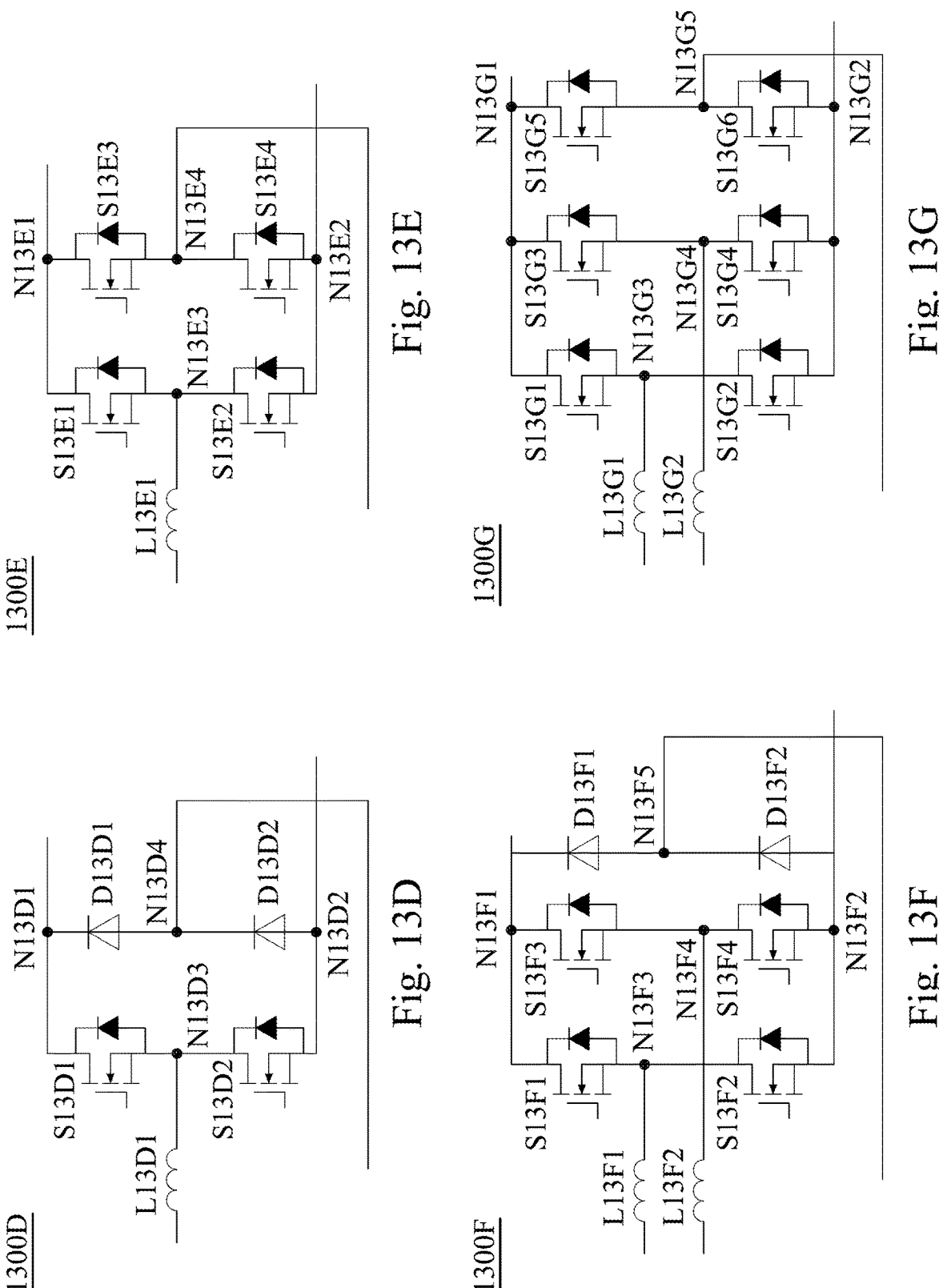

FIG. 13G is another circuit diagram of a regulator circuit 13006 according to an exemplary embodiment of the present disclosure. The regulator circuit 13006 is an alternative of the regulator circuit 1210 shown in FIG. 12. In some embodiments, the regulator circuit 13006 is coupled to the DC-DC converter 1230 at nodes N13B1 and N13B2. In some embodiments, the nodes N13B1 and N13B2 are coupled to the nodes N122 and N123, respectively.

As illustratively shown in FIG. 13B, the regulator circuit 13006 is the boost circuit and includes switches S13B1, S13B2 and a choke L13B1. The switches S13B1, S13B2 and the choke L13B1 are coupled to each other at the node N13B4. The switches S13B1 and S13B2 are coupled to the nodes N13B1 and N13B2, respectively.

In various embodiments, the switches S13B1 and S13B2 are included in the switch circuit 1010 or the switch circuit 1110 shown in FIG. 10 or 11. In some embodiments, the choke L13B1 is included in the choke part 1160 shown in FIG. 11.

FIG. 13C is another circuit diagram of a regulator circuit 1300C according to an exemplary embodiment of the present disclosure. The regulator circuit 1300C is an alternative of the regulator circuit 1210 shown in FIG. 12. In some embodiments, the regulator circuit 1300C is coupled to the DC-DC converter 1230 at nodes N13C1 and N13C2. In some embodiments, the nodes N13C1 and N13C2 are coupled to the nodes N122 and N123, respectively.

As illustratively shown in FIG. 13C, the regulator circuit 1300C is the boost circuit and includes switches S13C1-S13C4 and chokes L13C1, L13C2. The switches S13C1 and S13C2 are coupled to each other at the node N13C1. The switches S13C3 and S13C4 are coupled to each other at the node N13C2. The chokes L13C1, L13C2 are coupled in series. The choke L13C1 is coupled to the switches S13C1 and S13C3 at a node N13C3. The choke L13C2 is coupled to the switches S13C2 and S13C4 at a node N13C4.

In various embodiments, the switches S13C1-S13C4 are included in the switch circuit 1010 or the switch circuit 1110 shown in FIG. 10 or 11. In some embodiments, the chokes L13C1 and L13C2 are included in the choke part 1160 shown in FIG. 11.

FIG. 13D is another circuit diagram of a regulator circuit 1300D according to an exemplary embodiment of the present disclosure. The regulator circuit 1300D is an alternative of the regulator circuit 1210 shown in FIG. 12. In some embodiments, the regulator circuit 1300D is coupled to the DC-DC converter 1230 at nodes N13D1 and N13D2. In some embodiments, the nodes N13D1 and N13D2 are coupled to the nodes N122 and N123, respectively.

As illustratively shown in FIG. 13D, the regulator circuit 1300D is a totem PFC circuit and includes switches S13D1, S13D2, a choke L13D1 and diodes D13D1, D13D2. The choke L13D1, the switches S13D1 and S13D2 are coupled to each other at a node N13D3. The diodes D13D1 and D13D2 are coupled to each other at a node N13D4. The switch S13D1 is coupled to the diode D13D1 at a node N13D1. The switch S13D2 is coupled to the diode D13D2 at a node N13D2. In some embodiments, the voltage VIN is transmitted into the regulator circuit 1300D from the node N13D4 and the choke L13D1.

In various embodiments, the switches S13D1, S13D2 and the diodes D13D1 and D13D2 are included in the switch circuit 1010 or the switch circuit 1110 shown in FIG. 10 or

11. In some embodiments, the chokes L13D1 is included in the choke part 1160 shown in FIG. 11.

FIG. 13E is another circuit diagram of a regulator circuit 1300E according to an exemplary embodiment of the present disclosure. The regulator circuit 1300E is an alternative of the regulator circuit 1210 shown in FIG. 12. In some embodiments, the regulator circuit 1300E is coupled to the DC-DC converter 1230 at nodes N13E1 and N13E2. In some embodiments, the nodes N13E1 and N13E2 are coupled to the nodes N122 and N123, respectively.

As illustratively shown in FIG. 13E, the regulator circuit 1300E is a totem PFC circuit and includes switches S13E1-S13E4 and a choke L13E1. The choke L13E1, the switches S13E1 and S13E2 are coupled to each other at a node N13E3. The switches S13E3 and S13E4 are coupled to each other at a node N13E4. The switch S13E1 is coupled to the switch S13E3 at a node N13E1. The switch S13E2 is coupled to the switch S13E4 at a node N13E2. In some embodiments, the voltage VIN is transmitted into the regulator circuit 1300E from the node N13E4 and the choke L13E1.

In various embodiments, the switches S13E1-S13E4 are included in the switch circuit 1010 or the switch circuit 1110 shown in FIG. 10 or 11. In some embodiments, the chokes L13E1 is included in the choke part 1160 shown in FIG. 11.

FIG. 13F is another circuit diagram of a regulator circuit 1300F according to an exemplary embodiment of the present disclosure. The regulator circuit 1300F is an alternative of the regulator circuit 1210 shown in FIG. 12. In some embodiments, the regulator circuit 1300F is coupled to the DC-DC converter 1230 at nodes N13F1 and N13F2. In some embodiments, the nodes N13F1 and N13F2 are coupled to the nodes N122 and N123, respectively.

As illustratively shown in FIG. 13F, the regulator circuit 1300F is a totem PFC circuit and includes switches S13F1-S13F4, diodes D13F1, D13F2 and chokes L13F1, L13F2. The choke L13F1, the switches S13F1 and S13F2 are coupled to each other at a node N13F3. The choke L13F2, the switches S13F3 and S13F4 are coupled to each other at a node N13F4. The diode D13F1, the switches S13F1 and S13F3 are coupled to each other at the node N13F1. The diode D13F2, the switches S13F2 and S13F4 are coupled to each other at the node N13F2. The diodes D13F1, D13F2 are coupled to each other at a node N13F5. In some embodiments, the voltage VIN is transmitted into the regulator circuit 1300F from the node N13F5 and the chokes L13F1, L13F2.

In various embodiments, the switches S13F1-S13F4 and the diodes D13F1, D13F2 are included in the switch circuit 1010 or the switch circuit 1110 shown in FIG. 10 or 11. In some embodiments, the chokes L13F1 and L13F2 are included in the choke part 1160 shown in FIG. 11.

FIG. 13G is another circuit diagram of a regulator circuit 1300G according to an exemplary embodiment of the present disclosure. The regulator circuit 1300G is an alternative of the regulator circuit 1210 shown in FIG. 12. In some embodiments, the regulator circuit 1300G is coupled to the DC-DC converter 1230 at nodes N13G1 and N13G2. In some embodiments, the nodes N13G1 and N13G2 are coupled to the nodes N122 and N123, respectively.

As illustratively shown in FIG. 13G, the regulator circuit 1300G is a totem PFC circuit and includes switches S13G1-S13G6 and chokes L13G1, L13G2. The choke L13G1, the switches S13G1 and S13G2 are coupled to each other at a node N13G3. The choke L13G2, the switches S13G3 and S13G4 are coupled to each other at a node N13G4. The switch S13G5, S13G1 and S13G3 are coupled to each other at the node N13G1. The switch S13G6, S13G2 and S13G4 are coupled to each other at the node N13G2. The switches S13G5, S13G6 are coupled to each other at a node N13G5. In some embodiments, the voltage VIN is transmitted into the regulator circuit 1300G from the node N13G5 and the chokes L13G1, L13G2.

In various embodiments, the switches S13G1-S13G6 are included in the switch circuit 1010 or the switch circuit 1110 shown in FIG. 10 or 11. In some embodiments, the chokes L13G1 and L13G2 are included in the choke part 1160 shown in FIG. 11.

Figures 14A, 14B:
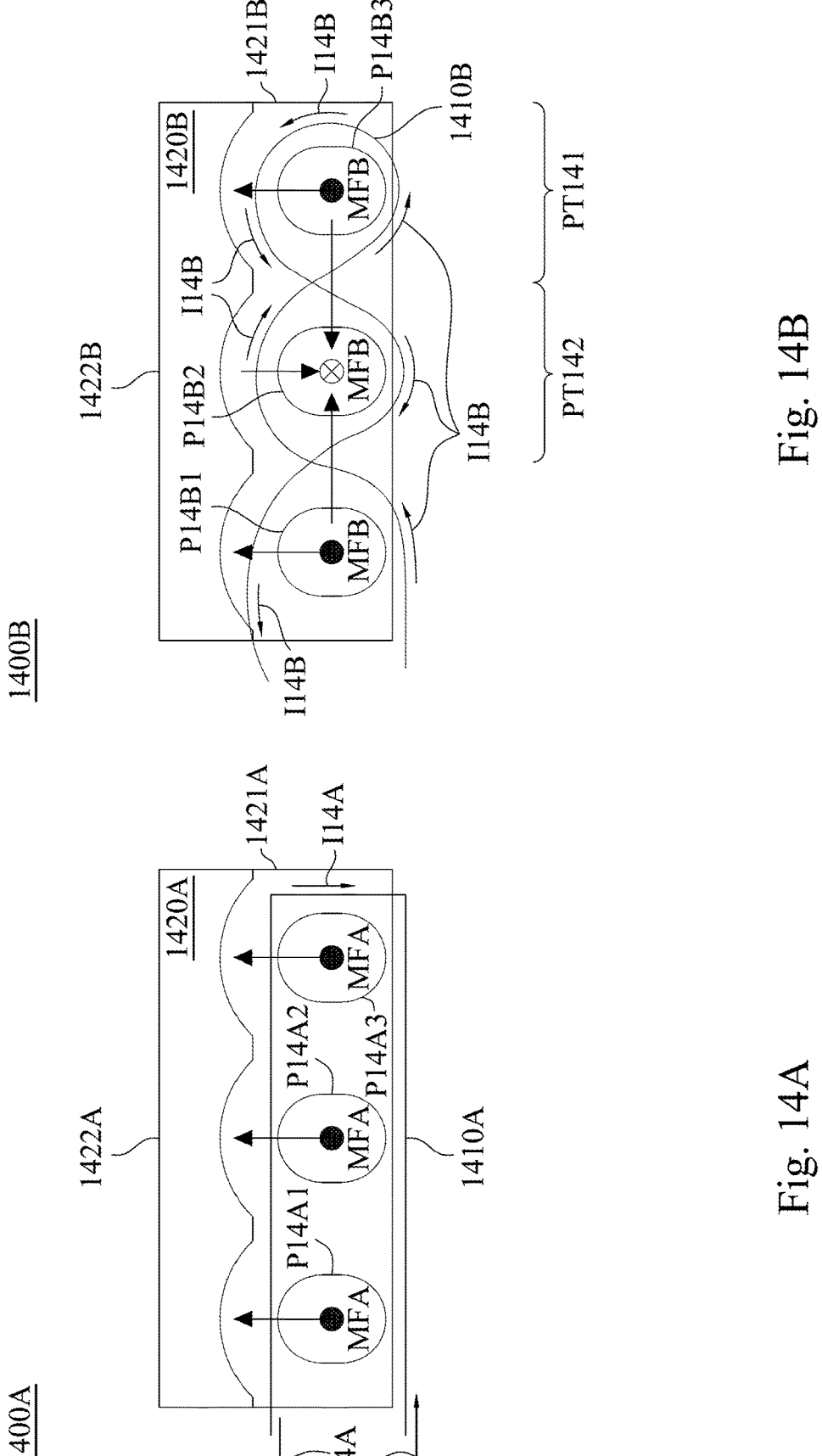
FIG. 14A is a block diagram of a magnetic element according to an exemplary embodiment of the present disclosure.
FIG. 14B is a block diagram of a magnetic element according to an exemplary embodiment of the present disclosure.

FIG. 14A is a block diagram of a magnetic element according to an exemplary embodiment of the present disclosure. As illustratively shown in FIG. 14A, a magnetic element 1400A includes a primary winding 1410A and a core structure 1420A. The primary winding 1410A is an embodiment of the primary winding 62 shown in FIG. 2 and FIG. 3. The core structure 1420A is an embodiment of the core structure 61 shown in FIG. 2 and FIG. 3.

In some embodiments, the primary winding 1410A is coupled to a primary winding circuit, such as the primary winding circuit 7 shown in FIGS. 2-5.

As illustratively shown in FIG. 14A, the core structure 1420A includes magnetic cover 1421A, a common side pole 1422A and three winding poles P14A1-P14A3. The magnetic cover 1421A is an embodiment of the first magnetic cover 65 shown in FIG. 3. The common side pole 1422A is an embodiment of the common side pole 68 shown in FIG. 3. The winding poles P14A1-P14A3 are embodiment of the inductor magnetic pole 69 and the transformer magnetic pole 67 shown in FIGS. 6, 7. The number of the magnetic poles included in the core structure 1420A is not limited to three. Other numbers of magnetic poles are within the contemplated scope of the present disclosure.

As illustratively shown in FIG. 14A, the common side pole 1422A and the winding poles P14A1-P14A3 are disposed on the magnetic cover 1421A, and the winding poles P14A1-P14A3 are opposite to the common side pole 1422A. The primary winding 1410A surrounds all the winding poles P14A1-P14A3.

In some embodiments, a current 114A flows through the primary winding 1410A. In a view of the winding poles P14A1-P14A3, the current 114A flows clockwise, such that magnetic fluxes MFA passing through the winding poles P14A1-P14A3 have same directions.

FIG. 14B is a block diagram of a magnetic element according to an exemplary embodiment of the present disclosure. As illustratively shown in FIG. 14B, a magnetic element 1400B includes a primary winding 1410B and a core structure 1420B. The magnetic element 1400B is similar with the magnetic element 1400A shown in FIG. 14A. For brevity, the discussion will focus more on differences between the magnetic elements 1400A and 1400B than on similarities.

As illustratively shown in FIG. 14B, the core structure 1420B includes magnetic cover 1421B, a common side pole 1422B and three winding poles P14B1-P14B3. The configuration of the common side pole 1422B and the winding poles P14B1-P14B3 is similar with the common side pole 1422A and the winding poles P14A1-P14A3 shown in FIG. 14A.

The differences between the magnetic elements 1400A and 1400B include that the primary winding 1410B includes portions PT141 and PT142. As illustratively shown in FIG. 14B, the portions PT141 and PT142 surrounds the winding poles P14B3 and P14B2, respectively. The portions PT141 and PT142 forms a co shape. For example, when the current 114B flows clockwise in the portion PT142, the current 114B flows anticlockwise in the portion PT141. As results, magnetic fluxes MFB passing through the winding poles P14B3 and P14B2 have different directions.

Comparing to some previous approaches, according to the embodiment of the present disclosure shown in FIG. 14B, the arrangement of the primary winding 1410B causes the magnetic fluxes of the magnetic cover 1421B evenly distributed, such that the core loss of the magnetic cover 1421B is reduced.

Figure 15:
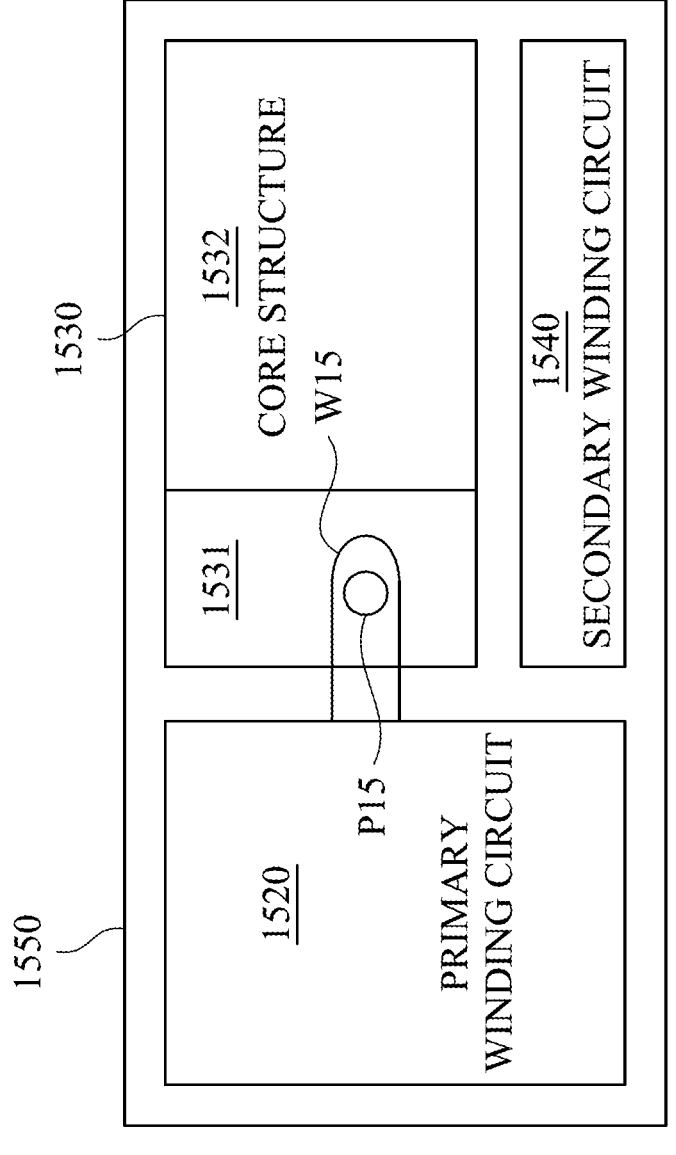
FIG. 15 is a block diagram of a power module according to an exemplary embodiment of the present disclosure.

FIG. 15 is a block diagram of a power module 1500 according to an exemplary embodiment of the present disclosure. The power module 1500 is an embodiment of one of the power modules 500, 1000, 1100 shown in FIGS. 5, 10, 11.

As illustratively shown in FIG. 15, the power module 1500 includes a primary winding circuit 1520, a magnetic element 1530, a secondary winding circuit 1540 and a PCB 1550. The primary winding circuit 1520, the magnetic element 1530 and the secondary winding circuit 1540 are disposed on the PCB 1550.

As illustratively shown in FIG. 15, the magnetic element 1530 includes core structures 1531 and 1532. The core structure 1531 is arranged between the core structure 1532 and the primary winding circuit 1520.

As illustratively shown in FIG. 15, the core structure 1531 includes an inductor winding pole P15 and an inductor winding W15. The inductor winding pole P15 is an embodiment of the inductor magnetic pole 69 shown in FIG. 6. The inductor winding W15 is an embodiment of a portion of the primary windings 62, 1410A or 1410B shown in FIG. 3, 14A or 14B.

In some embodiments, the inductor winding W15 surrounds around the inductor winding pole P15 to form an inductor, such as the inductor L122 included in the resonant network shown in FIG. 12. In some embodiments, the inductor winding pole P15 is coupled to the primary winding circuit 1520. In some embodiments, the core structure 1531 further includes an inductor magnetic cover (not shown), and the inductor winding pole P15 is disposed on the inductor magnetic cover.

On the other hand, the core structure 1532 includes a transformer magnetic cover (not shown), a transformer winding pole and a transformer winding. The transformer winding pole is an embodiment of the transformer magnetic pole 67 shown in FIG. 6. The transformer winding includes a portion of the primary windings 62, 1410A or 1410B shown in FIG. 3, 14A or 14B and the secondary winding 63 shown in FIG. 3. In some embodiments, the transformer winding surrounds around the transformer winding pole to form a transformer, such as the transformer T.

In some embodiments, the inductor magnetic cover and the transformer magnetic cover are separated with each other. The shape of the inductor magnetic cover and the transformer magnetic cover can be similar with or different from the magnetic cover shown in FIGS. 2-7.

Comparing to some previous approaches, according to the embodiment of the present disclosure shown in FIG. 15, the arrangement of the core structures 1531 and 1532 facilitates to control a gap between the inductor L122 and the transformer, and improves a utilization of the PCB 1550 of the power module 1500.

Figure 16A:
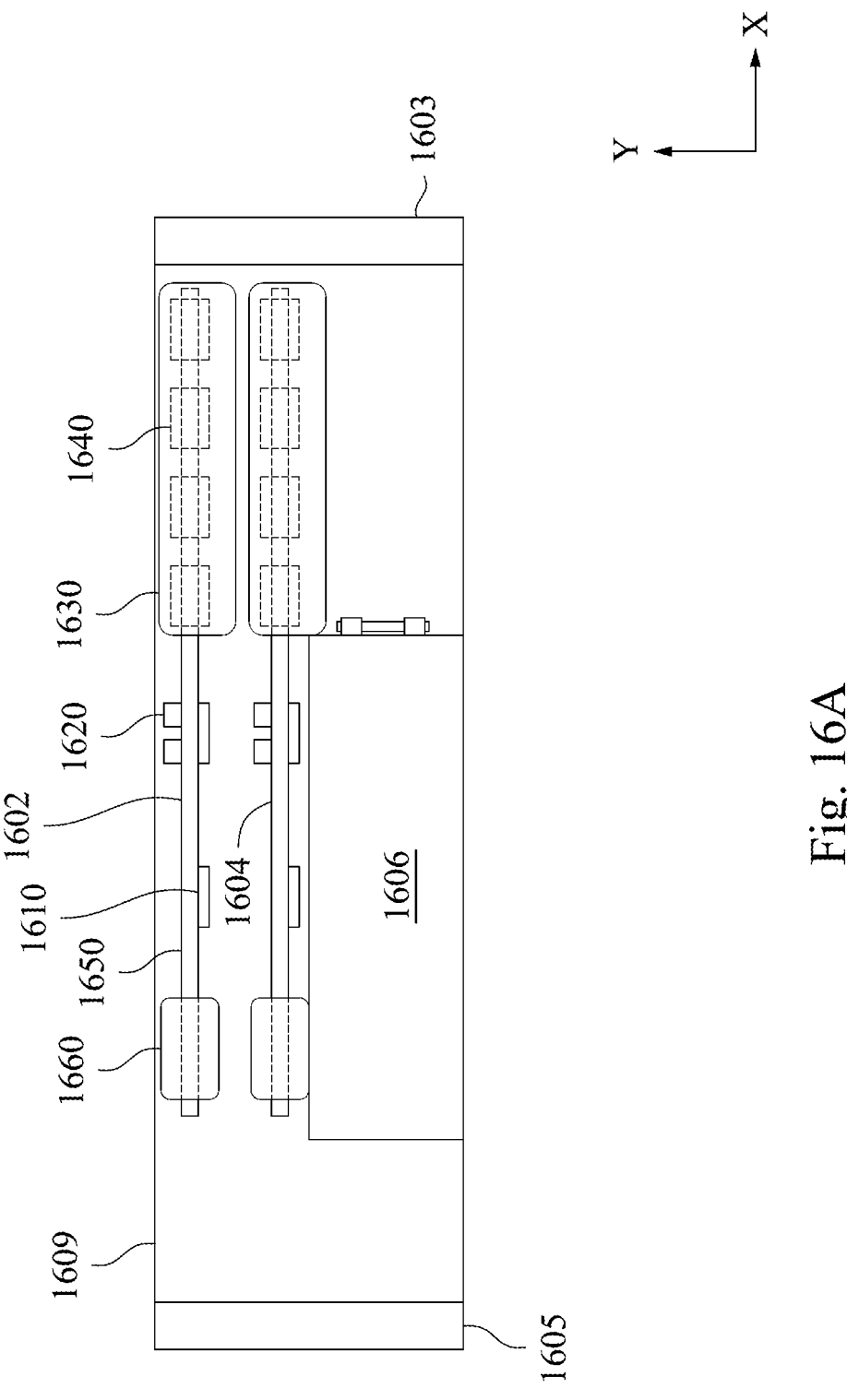
FIGS. 16A, 16B, 17A-17C and 18A-18D are block diagrams of different power devices according to exemplary embodiments of the present disclosure.

FIG. 16A is a block diagram of a power device 1600A according to an exemplary embodiment of the present disclosure. The power device 1600A is an alternative of the power devices shown in FIGS. 8 and 9.

As illustratively shown in FIG. 16A, the power device 1600A includes power modules 1602, 1604, a bulk capacitor 1606, and a mainboard 1609. The power modules 1602, 1604 are embodiments of the power module 1100 shown in FIG. 11. The bulk capacitor 1606 is an embodiment of the bulk capacitor 1220 shown in FIG. 12.

As illustratively shown in FIG. 16A, the power modules 1602, 1604 and the bulk capacitor 1606 are disposed on the mainboard 1609. In some embodiments, the power device 1600A further includes an input terminal 1605 and an output terminal 1603 which are coupled to the power modules 1602 and 1604.

It is noted that the number of power modules is not limited to two, other numbers of the power modules are within the contemplated scope of the present disclosure.

As illustratively shown in FIG. 16A, the power module 1602 includes a switch circuit 1610, a primary winding circuit 1620, a magnetic element 1630, a secondary winding circuit 1640, a PCB 1650 and a choke part 1660. The switch circuit 1610, the primary winding circuit 1620, the magnetic element 1630, the secondary winding circuit 1640, the PCB 1650 and the choke part 1660 correspond to the switch circuit 1110, the primary winding circuit 1120, the magnetic element 1130, the secondary winding circuit 1140, the PCB 1150 and the choke part 1160 shown in FIG. 11, respectively. The switch circuit 1610, the primary winding circuit 1620, the magnetic element 1630, the secondary winding circuit 1640 and the choke part 1660 are disposed on the PCB 1650.

In some embodiments, an X-direction is defined by the direction from the input terminal 1605 to the output terminal 1603 of the power device 1600A. The PCB 1650 is disposed on the mainboard 1609 such that the primary winding circuit 1620 and the magnetic element 1630 are arranged in the X-direction in order. In other word, the PCB 1650 is disposed on the mainboard 1609 with the first direction of the PCB 1650 corresponding to the X-direction from an input terminal 1605 to the output terminal 1603 of the power device 1600A.

In various embodiments, the switch circuit 1610 includes at least one of the switches S121, S13A1, S13A2, S13B1, S13B2, S13C1-S13C4, S13D1, S13D2, S13E1-S13E4, S13F1-S13F4, S13G1-S13G6, and the diodes D121, D13A1, D13A2, D13D1, D13D2, D13F1, D13F2 shown in FIGS. 12, 13A-13G. In various embodiments, the choke part 1660 include at least one of the chokes L121, L13A1, L13A2, L13B1, L13C1, L13C2, L13D1, L13E1, L13F1, L13F2, L13G1 and L13G2 shown in FIGS. 12, 13A-13G.

In some embodiments, the power module 1604 is arranged beside the power module 1602. The power module 1604 is similar with the power module 1602, and thus details of the power module 1604 are not described herein for brevity. In some other embodiments, the power module 1604 is different with the power module 1602.

As illustratively shown in FIG. 16A, the bulk capacitor 1606 is disposed on the mainboard, and arranged with the PCB 1650 in a Y-direction orthogonal to the X-direction. In other words, the bulk capacitor 1606 arranged with the power modules 1602 and 1604 in the Y-direction.

In some embodiments, the power device 1600A can operate when it is immersed in a liquid, in which the liquid can bring the heat of the power device 1600A and cool the power device 1600A.

Figure 16B:
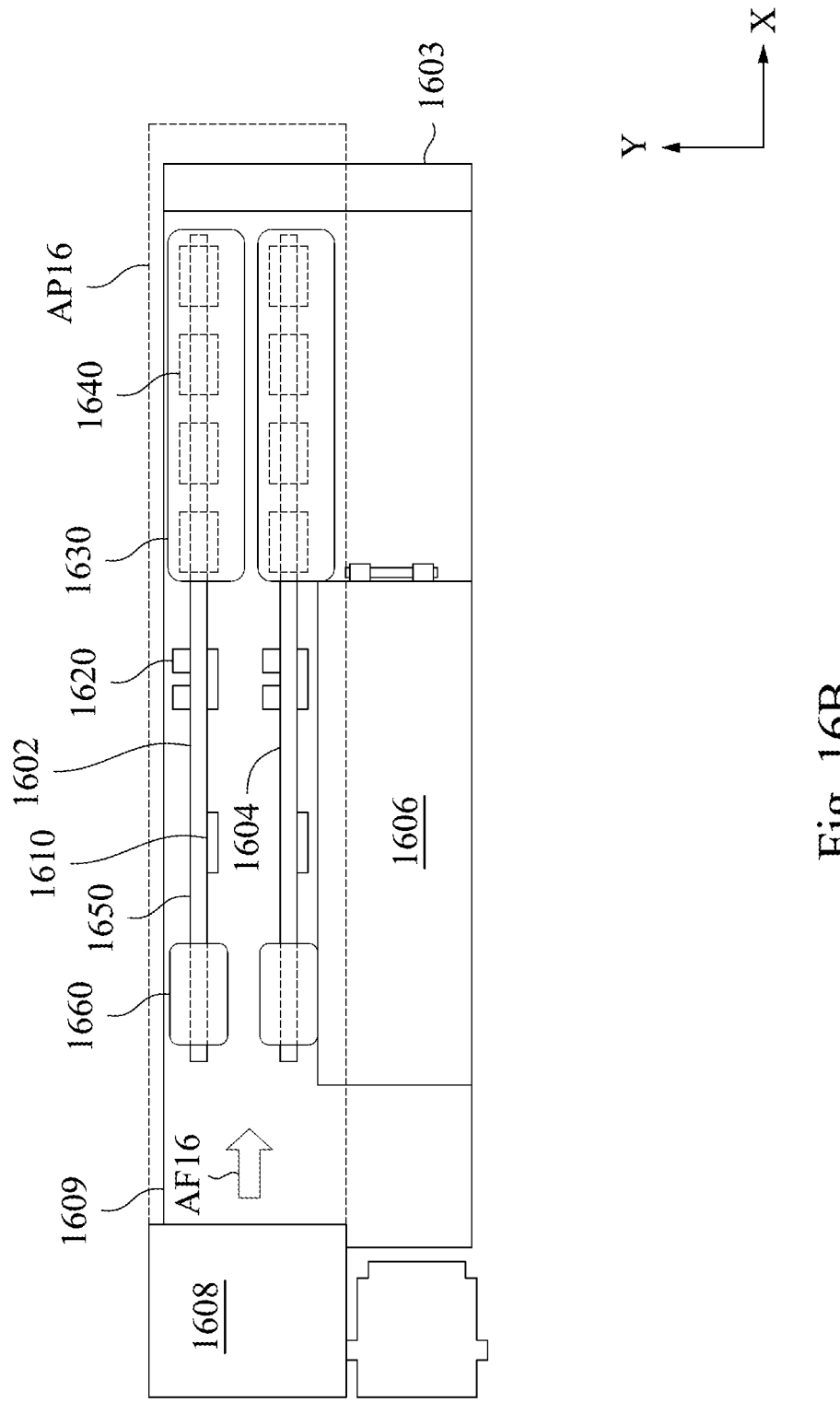

In other embodiments, the power device further includes a fan to cool the power device 1600A. As illustratively shown in FIG. 16B with reference to FIG. 16A, comparing to the power device 1600A, the power device 1600B further includes a fan 1608. The fan 1608 is attached to the mainboard 1609 at an end of the mainboard 1609 in X-direction. The fan 1608 is configured to generate an airflow AF16 flowing in an X-direction and an air passage AP16 is formed due to the airflow AF16. According to the layout described above of the power device 1600B, the power modules 1602 and 1604 are disposed in the air passage AP16, and the bulk capacitor 1606 does not hinder the airflow AF16 flowing by the power modules 1602 and 1604, and thereby better thermal conductivity can be realized.

Figure 17A:
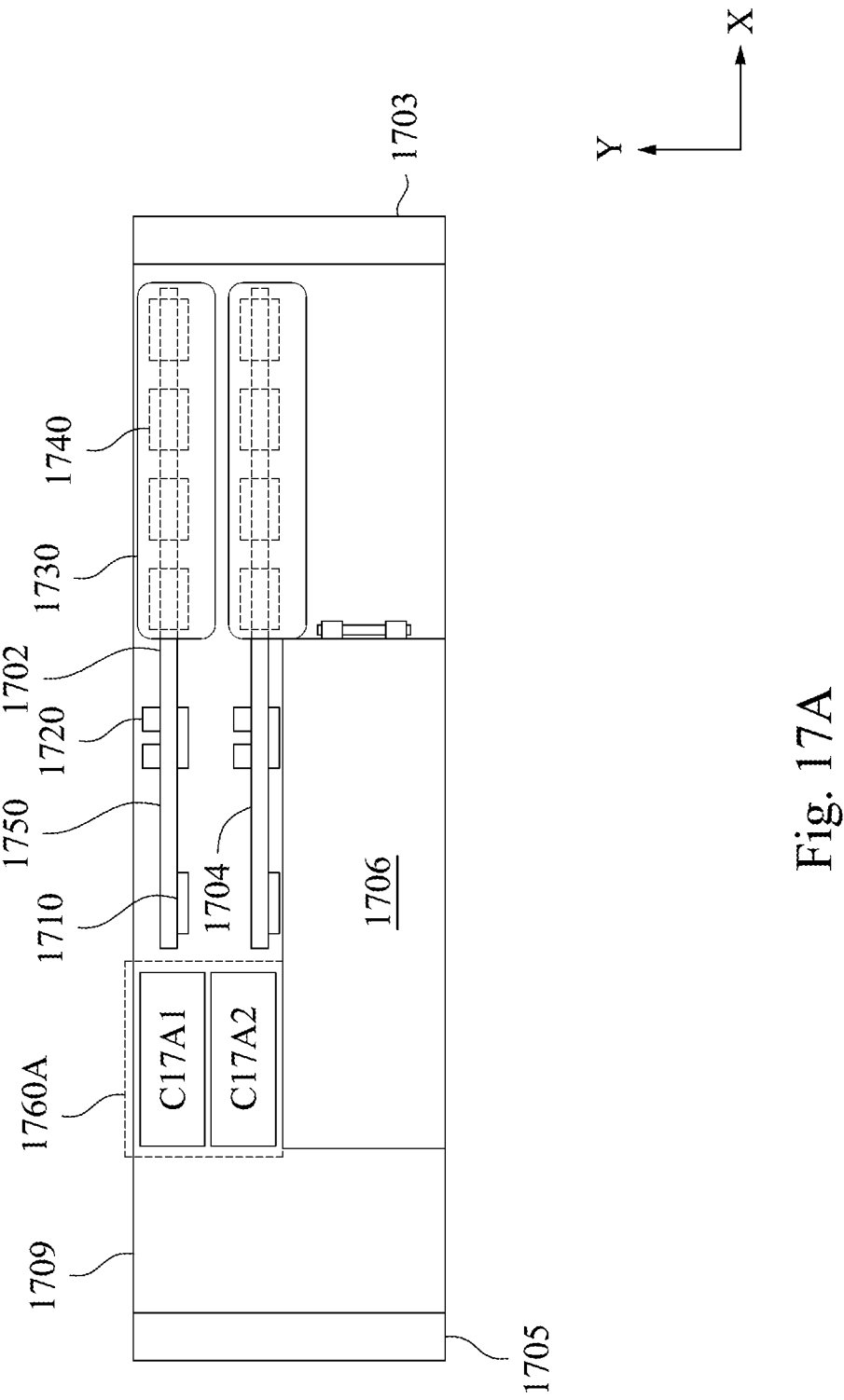

FIG. 17A is a block diagram of a power device 1700A according to an exemplary embodiment of the present disclosure. The power device 1700A is an alternative of the power devices shown in FIGS. 8 and 9.

As illustratively shown in FIG. 17A, the power device 1700A includes power modules 1702, 1704, a bulk capacitor 1706, a choke part 1760A and a mainboard 1709. The power modules 1702, 1704 are embodiments of the power module 1000 shown in FIG. 10. The bulk capacitor 1706 is an embodiment of the bulk capacitor 1220 shown in FIG. 12.

As illustratively shown in FIG. 17A, the choke part 1760A, the power modules 1702, 1704 and the bulk capacitor 1706 are disposed on the mainboard 1709. In some embodiments, the power device 1700A further includes an input terminal 1705 and an output terminal 1703 which are coupled to the power modules 1702 and 1704.

As illustratively shown in FIG. 17A, the choke part 1760A and the power modules 1702 or 1704 are disposed in the mainboard along the X-direction in order. It is noted that the number of power modules is not limited to two, other numbers of the power modules are within the contemplated scope of the present disclosure.

As illustratively shown in FIG. 17A, the power module 1702 includes a switch circuit 1710, a primary winding circuit 1720, a magnetic element 1730, a secondary winding circuit 1740 and a PCB 1750. The switch circuit 1710, the primary winding circuit 1720, the magnetic element 1730, the secondary winding circuit 1740 and the PCB 1750 correspond to the switch circuit 1010, the primary winding circuit 1020, the magnetic element 1030, the secondary winding circuit 1040 and the PCB 1050 shown in FIG. 10, respectively. The switch circuit 1710, the primary winding circuit 1720, the magnetic element 1730 and the secondary winding circuit 1740 are disposed on the PCB 1750. In some embodiments, the X-direction is defined by the direction from the input terminal 1705 to the output terminal 1703 of the power device 1700A. The PCB 1750 is disposed on the mainboard 1709 such that the primary winding circuit 1720 and the magnetic element 1730 are arranged in the X-direction in order. In other word, the PCB 1750 is disposed on the mainboard 1709 with the first direction of the PCB 1750 corresponding to the X-direction from the input terminal 1705 to the output terminal 1703 of the power device 1700A.

In various embodiments, the switch circuit 1710 includes at least one of the switches S121, S13A1, S13A2, S13B1, S13B2, S13C1-S13C4, S13D1, S13D2, S13E1-S13E4, S13F1-S13F4, S13G1-S13G6, and the diodes D121, D13A1, D13A2, D13D1, D13D2, D13F1, D13F2 shown in FIGS. 12, 13A-13G.

As illustratively shown in FIG. 17A, the choke part 1760A includes chokes C17A1 and C17A2. In some embodiments, the chokes C17A1 and C17A2 are traditional winding chokes.

In various embodiments, at least one of the chokes L121, L13A1 and L13A2 shown in FIGS. 12-13 are implemented by at least one of the chokes C17A1 and C17A2. For example, the choke C17A1 is configured to operate as the choke L121 and coupled to the switch S121, D121 included in the switch circuit 1710 in some embodiments. In various embodiments, the choke C17A1 is configured to operate as at least one of the chokes L121, L13A1, L13A2, L13B1, L13C1, L13C2, L13D1, L13E1, L13F1, L13F2, L13G1 and L13G2, and coupled to at least one of the corresponding switches S121, S13A1, S13A2, S13B1, S13B2, S13C1-S13C4, S13D1, S13D2, S13E1-S13E4, S13F1-S13F4, S13G1-S13G6 and/or at least one of the corresponding diodes D121, D13A1, D13A2, D13D1, D13D2, D13F1, D13F2 as shown in FIGS. 12, 13A-13G. The number of the chokes included in the choke part 1760A is not limited to two. Other numbers of chokes are within the contemplated scope of the present disclosure.

In some embodiments, the power module 1704 is arranged beside the power module 1702. In some embodiments, the choke C17A2 is coupled to a switch circuit included in the power module 1704. The power module 1704 is similar with the power module 1702, and thus details of the power module 1704 are not described herein for brevity. In some other embodiments, the power module 1704 is different with the power module 1702.

As illustratively shown in FIG. 17A, the bulk capacitor 1706 is disposed on the mainboard, and arranged with the PCB 1750 in a Y-direction orthogonal to the X-direction. In other words, the bulk capacitor 1706 arranged with the power modules 1702, 1704 and the choke part 1760A in the Y-direction.

In some embodiments, the power device 1700A can operate when it is immersed in a liquid, in which the liquid can bring the heat of the power device 1700A and cool the power device 1700A.

In other embodiments, the power device further includes a fan to cool the power device 1700A. As illustratively shown in FIG. 17C with reference to FIG. 17A, comparing to the power device 1700A, the power device 1700C further includes a fan 1708. The fan 1708 is attached to the mainboard 1709 at an end of the mainboard 1709 in the X-direction. The fan 1708 is configured to generate an airflow AF17 flowing in an X-direction. An air passage AP17 is formed due to the airflow AF17. The choke part 1760C and the power modules 1702, 1704 are disposed in the air passage AP17. The choke part 1760C is disposed on the mainboard 1709 and arranged between the power modules 1702, 1704 and the fan 1708 in the X-direction. According to the arrangement of the choke part 1760C, the power modules 1702, 1704, the fan 1708 and the bulk capacitor 1706, the bulk capacitor 1706 does not hinder the airflow AF17 flowing by the power modules 1702, 1704 and the choke part 1760C, and thereby better thermal conductivity can be realized.

Figure 17B:
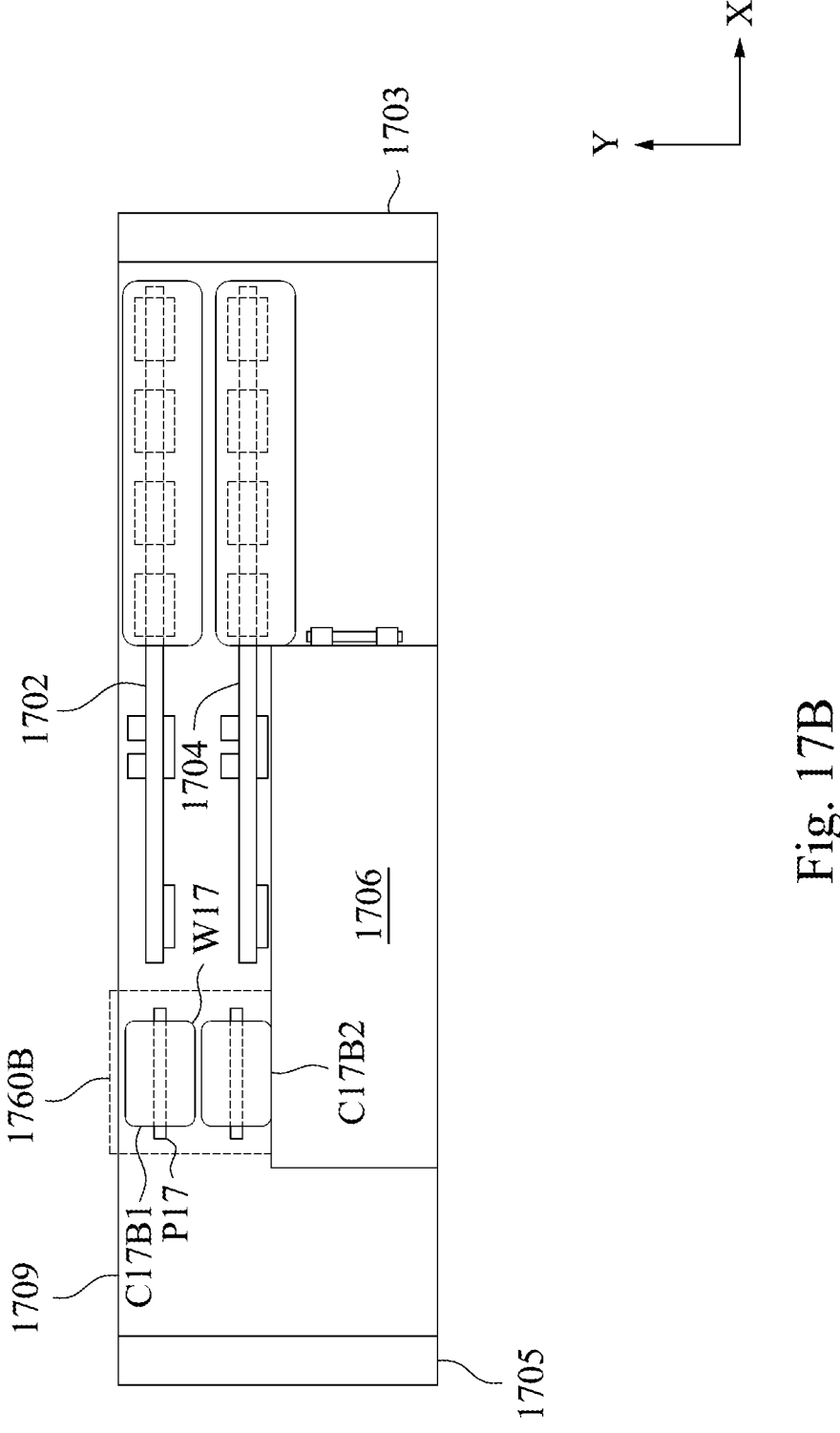
Figure 17C:
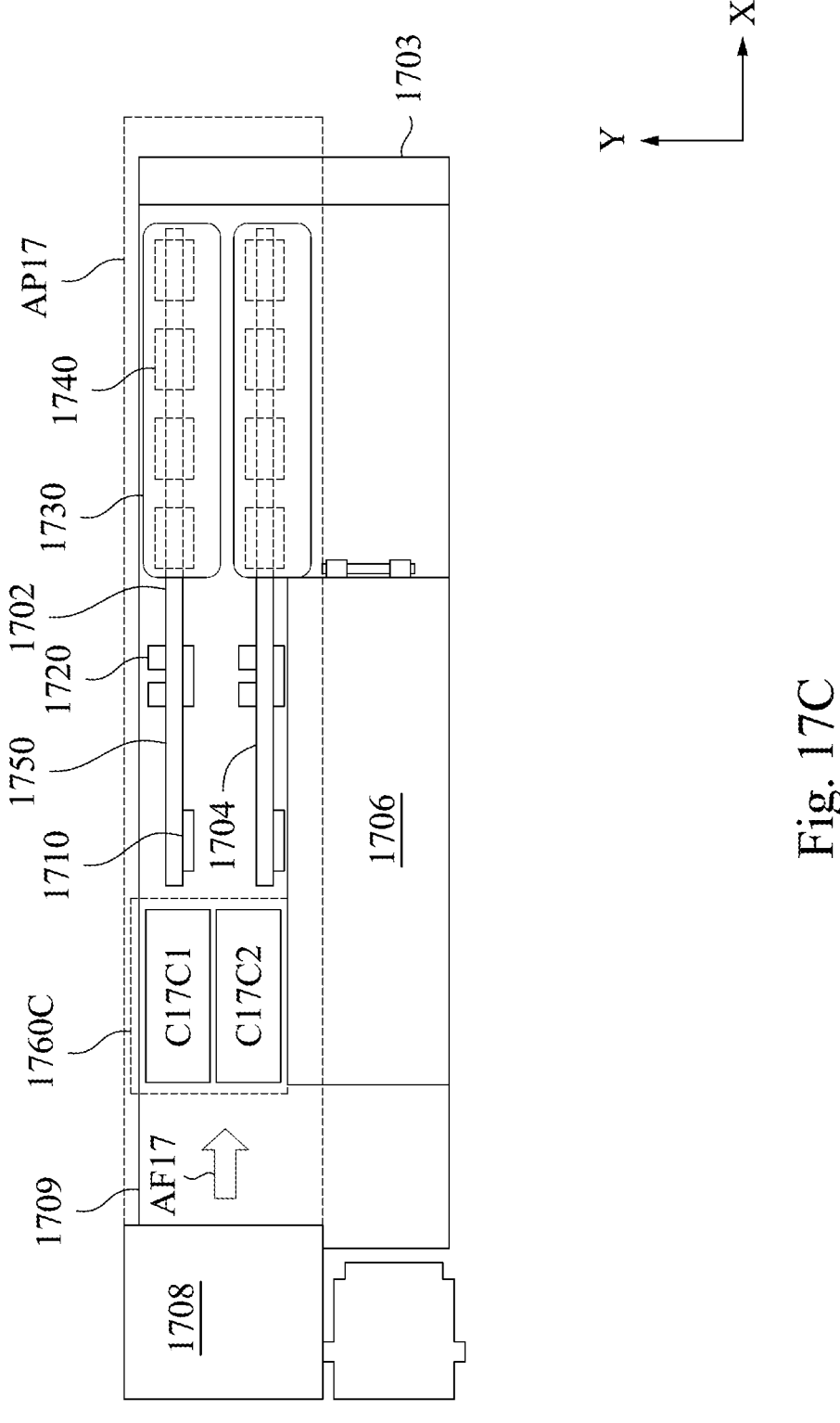

FIG. 17B is a block diagram of a power device 1700B according to an exemplary embodiment of the present disclosure. The power device 1700B is an alternative of the power device 1700A shown in FIG. 17A.

The power device 1700B is similar with the power device 1700A shown in FIG. 17A. For brevity, the discussion will focus more on differences between the power devices 1700A and 1700B than on similarities.

As illustratively shown in FIG. 17B, the differences between the power devices 1700A and 1700B include that the power device 1700B includes a choke part 1760B. The choke part 1760B is disposed on the mainboard 1709 and arranged with the power modules 1702 and/or 1704 along the X-direction.

As illustratively shown in FIG. 17B, the choke part 1760B includes chokes C17B1 and C17B2. The choke C17B1 includes a choke core (not shown), a PCB P17 and a choke winding W17. The choke core is disposed on the PCB P17.

The choke winding W17 surrounds around the choke core to form the choke. In some embodiments, a longitudinal side of the PCB P17 is in parallel with the X-direction.

In some embodiments, the choke C17B1 is arranged beside the choke C17B2. The choke C17B2 is similar with the choke C17B1, and thus details of the choke C17B2 are not described herein for brevity. In some other embodiments, the choke C17B2 is different with the choke C17B1.

In various embodiments, at least one of the chokes L121, L13A1, L13A2, L13B1, L13C1, L13C2, L13D1, L13E1, L13F1, L13F2, L13G1 and L13G2 shown in FIGS. 12, 13A-13G are implemented by at least one of the chokes C17B1 and C17B2. For example, the choke C17B1 is configured to operate as the choke L121 and coupled to the switch S121, D121 included in the switch circuit 1710 in some embodiments. In various embodiments, the choke C17B1 is configured to operate as at least one of the chokes L121, L13A1, L13A2, L13B1, L13C1, L13C2, L13D1, L13E1, L13F1, L13F2, L13G1 and L13G2, and coupled to at least one of the corresponding switches S121, S13A1, S13A2, S13B1, S13B2, S13C1-S13C4, S13D1, S13D2, S13E1-S13E4, S13F1-S13F4, S13G1-S13G6 and/or at least one of the corresponding diodes D121, D13A1, D13A2, D13D1, D13D2, D13F1, D13F2 included in the switch circuit 1710 as shown in FIGS. 12, 13A-13G. The number of the chokes included in the choke part 1760B is not limited to two. Other numbers of chokes are within the contemplated scope of the present disclosure.

Figure 18A:
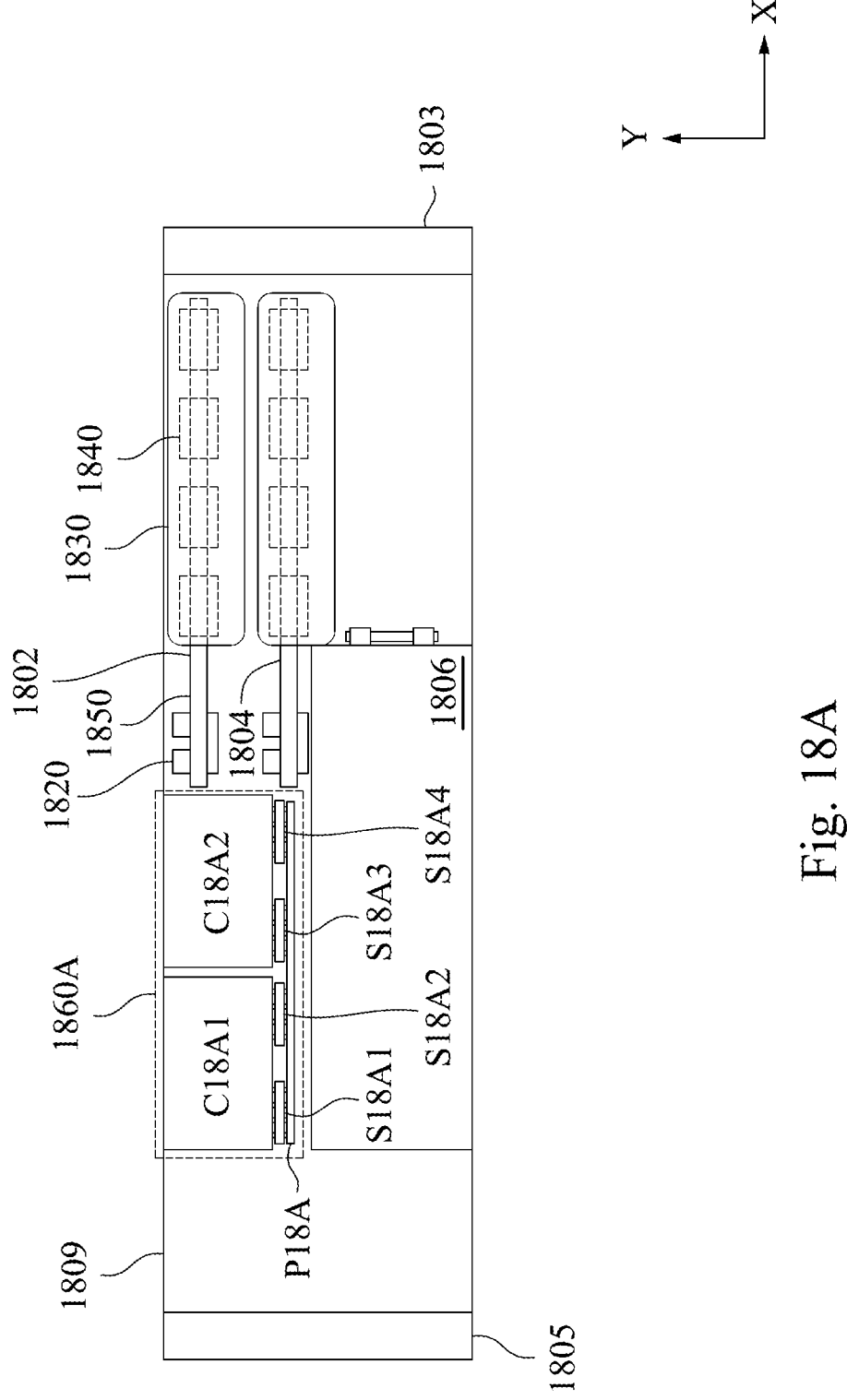

FIG. 18A is a block diagram of a power device 1800A according to an exemplary embodiment of the present disclosure. The power device 1800A is an alternative of the power devices shown in FIGS. 8 and 9.

As illustratively shown in FIG. 18A, the power device 1800A includes power modules 1802, 1804, a bulk capacitor 1806, a regulator 1860A and a mainboard 1809. The power modules 1802, 1804 are embodiments of the power module 500 shown in FIG. 2. The bulk capacitor 1806 is an embodiment of the bulk capacitor 1220 shown in FIG. 12.

As illustratively shown in FIG. 18A, the regulator 1860A, the power modules 1802, 1804 and the bulk capacitor 1806 are disposed on the mainboard 1809. In some embodiments, the power device 1800A further includes an input terminal 1805 and an output terminal 1803 which are disposed on the mainboard 1809 and coupled to the modules 1802, 1804.

In some embodiments, the regulator 1860A is configured to provide at least one voltage to at least one of the power modules 1802, 1804.

As illustratively shown in FIG. 18A, the regulator 1860A and the power modules 1802, 1804 are disposed in the mainboard along the X-direction in order. The number of power modules disposed in the air passage AP18 is not limited to two, other numbers of the power modules are within the contemplated scope of the present disclosure.

As illustratively shown in FIG. 18A, the power module 1802 includes a primary winding circuit 1820, a magnetic element 1830, a secondary winding circuit 1840 and a PCB 1850. The primary winding circuit 1820, the magnetic element 1830, the secondary winding circuit 1840 and the PCB 1850 correspond to the primary winding circuit 7, the magnetic element including the core structure 61, the secondary winding circuit 8 and the PCB 5 shown in FIG. 2, respectively. The primary winding circuit 1820, the magnetic element 1830 and the secondary winding circuit 1840 are disposed on the PCB 1850. The PCB 1850 is disposed on the mainboard 1809 with a longitudinal side of the PCB 1850 in parallel with the X-direction.

As illustratively shown in FIG. 18A, the regulator 1860A includes chokes C18A1, C18A2, a PCB P18A and switches S18A1-S18A4. The switches S18A1-S18A4 are disposed on the PCB P18A. The PCB P18A is disposed on the mainboard 1809 with a longitudinal side of the PCB P18A in parallel with the X-direction. In some embodiments, the chokes C18A1 and C18A2 are traditional winding chokes.

In some embodiments, the X-direction is defined by the direction from the input terminal 1805 to the output terminal 1803 of the power device 1800A. The PCB 1850 is disposed on the mainboard 1809 such that the primary winding circuit 1820 and the magnetic element 1830 are arranged in the X-direction in order. In other word, the PCB 1850 is disposed on the mainboard 1809 with the first direction of the PCB 1850 corresponding to the X-direction from the input terminal 1805 to the output terminal 1803 of the power device 1800A.

In various embodiments, at least one of the chokes L121, L13A1, L13A2, L13B1, L13C1, L13C2, L13D1, L13E1, L13F1, L13F2, L13G1 and L13G2 shown in FIGS. 12, 13A-13G are implemented by at least one of the chokes C18A1 and C18A2. Similarly, at least one of the switches S121, S13A1, S13A2, S13B1, S13B2, S13C1-S13C4, S13D1, S13D2, S13E1-S13E4, S13F1-S13F4, S13G1-S13G6 and/or at least one of the corresponding diodes D121, D13A1, D13A2, D13D1, D13D2, D13F1, D13F2 shown in FIGS. 12, 13A-13G are implemented by at least one of the switches S18A1-S18A4.

For example, the choke C18A1 is configured to operate as the chokes L13A1, L13A2 and coupled to the switches S18A1-S18A2 which are configured to operate as the switches S13A1, S13A2 in some embodiments. In various embodiments, the choke C18A1 is configured to operate as at least one of the chokes L121, L13A1, L13A2, L13B1, L13C1, L13C2, L13D1, L13E1, L13F1, L13F2, L13G1 and L13G2, and coupled to the switches S18A1-S18A2 which are configured to operate as at least one of the corresponding switches S121, S13A1, S13A2, S13B1, S13B2, S13C1-S13C4, S13D1, S13D2, S13E1-S13E4, S13F1-S13F4, S13G1-S13G6 and/or at least one of the corresponding diodes D121, D13A1, D13A2, D13D1, D13D2, D13F1, D13F2 as shown in FIGS. 12, 13A-13G. The numbers of the chokes and switches included in the regulator 1860A are not limited. Various numbers of chokes and switches are within the contemplated scope of the present disclosure.

In some embodiments, the power module 1804 is arranged beside the power module 1802. The power module 1804 is similar with the power module 1802, and thus details of the power module 1804 are not described herein for brevity. In some other embodiments, the power module 1804 is different with the power module 1802.

As illustratively shown in FIG. 18A, the bulk capacitor 1806 is disposed on the mainboard, and arranged with the PCB 1850 in a Y-direction orthogonal to the X-direction. In other words, the bulk capacitor 1806 arranged with the power modules 1802, 1804 and the regulator 1860A in the Y-direction.

In some embodiments, the power device 1800A can operate when it is immersed in a liquid, in which the liquid can bring the heat of the power device 1800A and cool the power device 1800A.

In other embodiments, the power device further includes a fan to cool the power device 1800A. As illustratively shown in FIG. 18D with reference to FIG. 18A, comparing to the power device 1800A, the power device 1800D further includes a fan 1808. The fan 1808 is attached to the mainboard 1809 at an end of the mainboard 1809 in the X-direction. The fan 1808 is configured to generate an airflow AF18 flowing in the X-direction. An air passage AP18 is formed due to the airflow AF18. The regulator 1860D and the power modules 1802, 1804 are disposed in the air passage AP18. The regulator 1860D is disposed on the mainboard 1809 and arranged between the power modules 1802, 1804 and the fan 1808. The bulk capacitor 1806 does not hinder the airflow AF18 flowing by the power modules 1802, 1804 and the regulator 1860D.

Comparing to some previous approaches, the arrangement of the regulator 1860D, the power modules 1802, 1804, the fan 1808 and the bulk capacitor 1806 improves thermal conductivity of the power device 1800D.

Figure 18B:
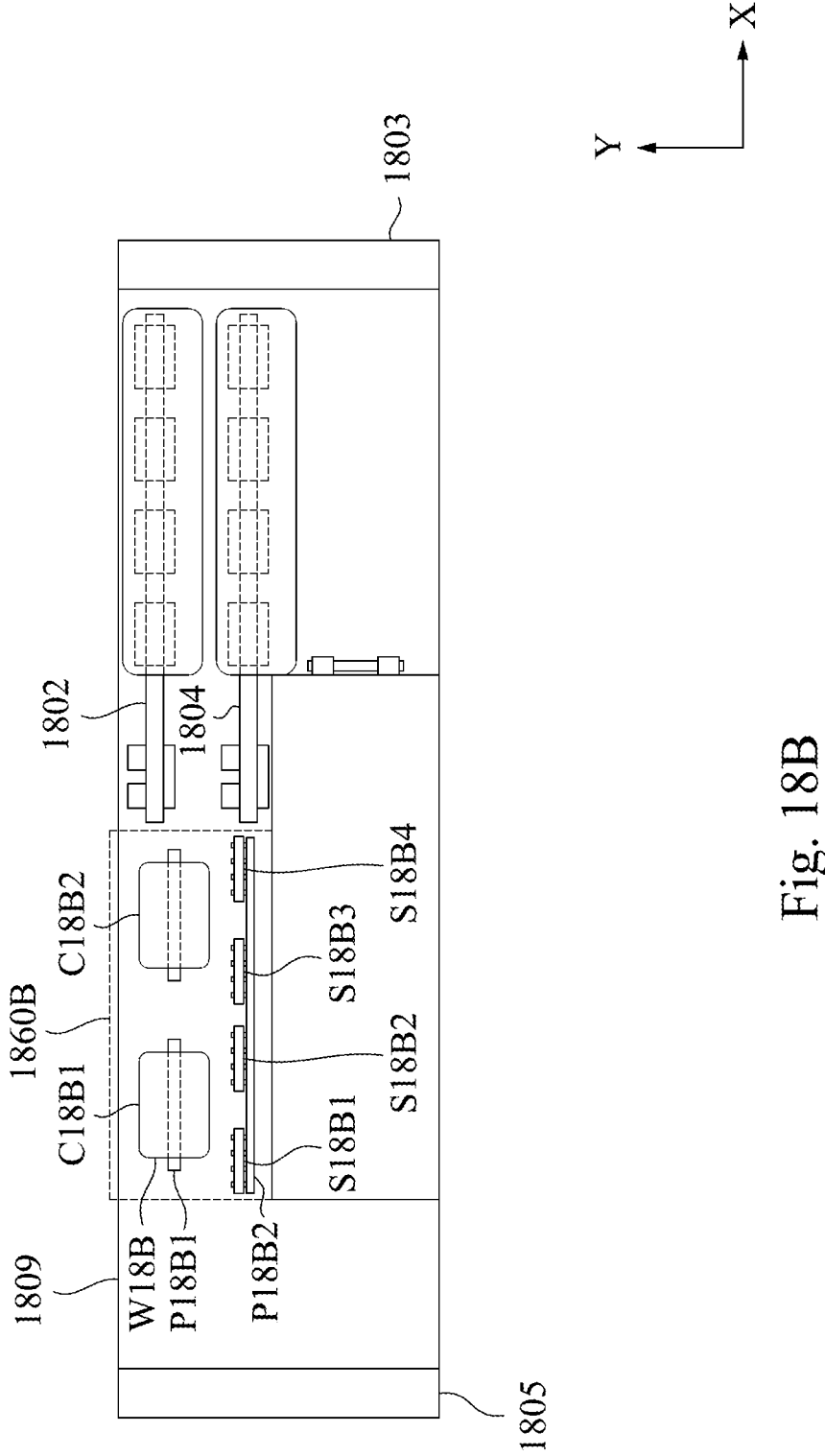

FIG. 18B is a schematic diagram of a power device 1800B according to an exemplary embodiment of the present disclosure. The power device 1800B is an alternative of the power device 1800A shown in FIG. 18A.

The power device 1800B is similar with the power device 1800A shown in FIG. 18A. For brevity, the discussion will focus more on differences between the power devices 1800A and 1800B than on similarities.

As illustratively shown in FIG. 18B, the differences between the power devices 1800A and 1800B include that the power device 1800B includes a regulator 1860B. The regulator 1860B is disposed on the mainboard 1809. In some embodiments, the regulator 1860B is configured to provide at least one voltage to at least one of the power modules 1802, 1804.

As illustratively shown in FIG. 18B, the regulator 1860B includes chokes C18B1 and C18B2. The choke C18B1 includes a choke core, a PCB P18B1 and a choke winding W18B. The choke core is disposed on the PCB P18B1. The choke winding W18B surrounds around the choke core to form the choke C18B1. A longitudinal side of the PCB P18B1 is in parallel with the X-direction.

In some embodiments, the choke C18B1 is arranged beside the choke C18B2. The choke C18B2 is similar to the choke C18B1, and thus details of the choke C18B2 are not described herein for brevity. In some other embodiments, the choke C18B2 is different with the choke C18B1.

As illustratively shown in FIG. 18B, the regulator 1860B further includes a PCB P18B2 and switches S18B1-S18B4. The switches S18B1-S18B4 are disposed on the PCB P1862.

In various embodiments, at least one of the L121, L13A1, L13A2, L13B1, L13C1, L13C2, L13D1, L13E1, L13F1, L13F2, L13G1 and L13G2 shown in FIGS. 12, 13A-13G are implemented by at least one of the chokes C18B1 and C18B2. Similarly, at least one of the switches S121, S13A1, S13A2, S13B1, S13B2, S13C1-S13C4, S13D1, S13D2, S13E1-S13E4, S13F1-S13F4, S13G1-S13G6 and/or at least one of the corresponding diodes D121, D13A1, D13A2, D13D1, D13D2, D13F1, D13F2 shown in FIGS. 12, 13A-13G are implemented by at least one of the switches S18B1-S18B4.

For example, the choke C18B1 is configured to operate as the chokes L13A1, L13A2 and coupled to the switches S1861-S18B2 which is configured to operate as the switches S13A1, S13A2 in some embodiments. The numbers of the chokes and switches included in the regulator 1860B are not limited. Various numbers of chokes and switches are within the contemplated scope of the present disclosure.

Figure 18C:
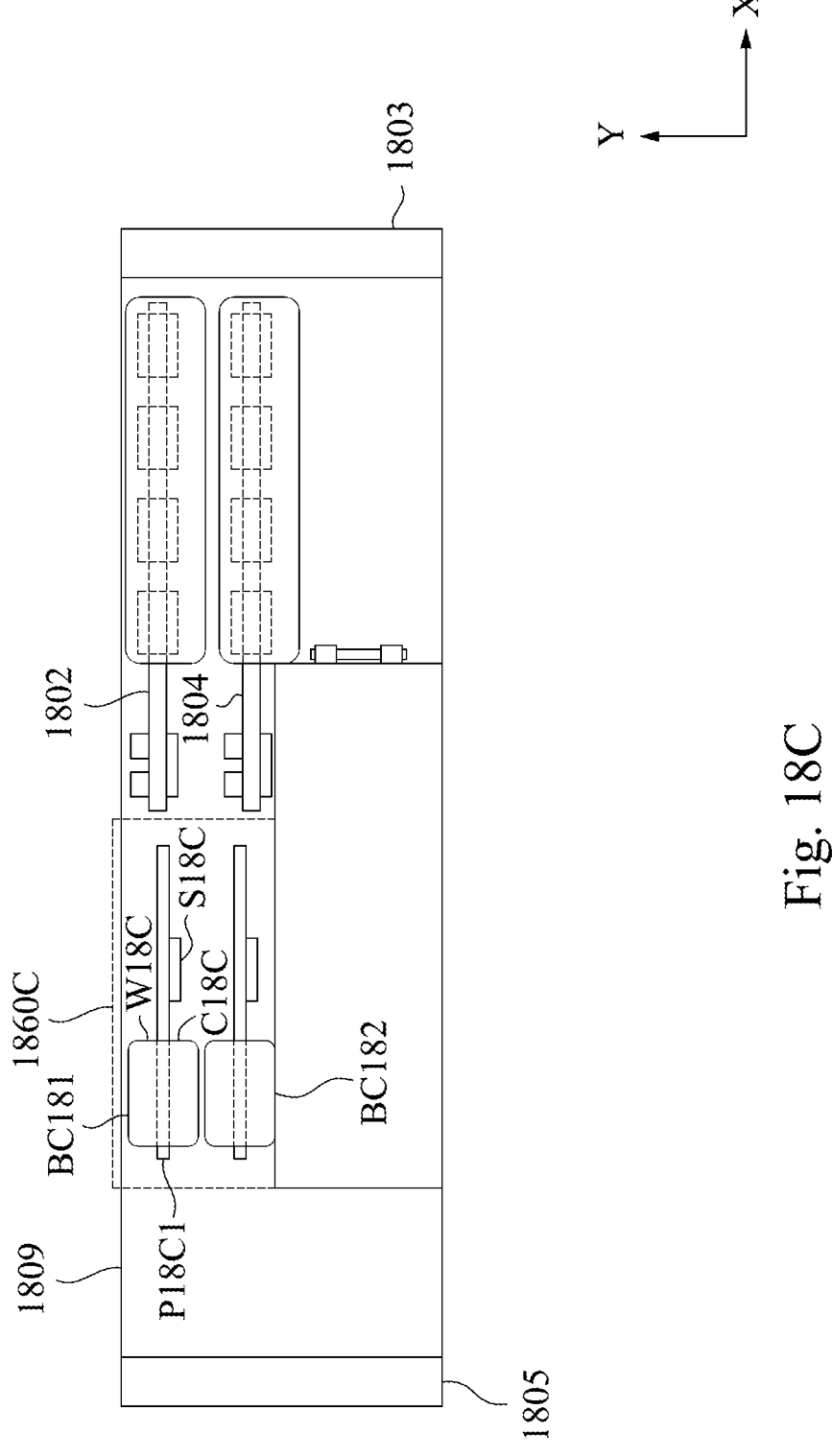
Figure 18D:
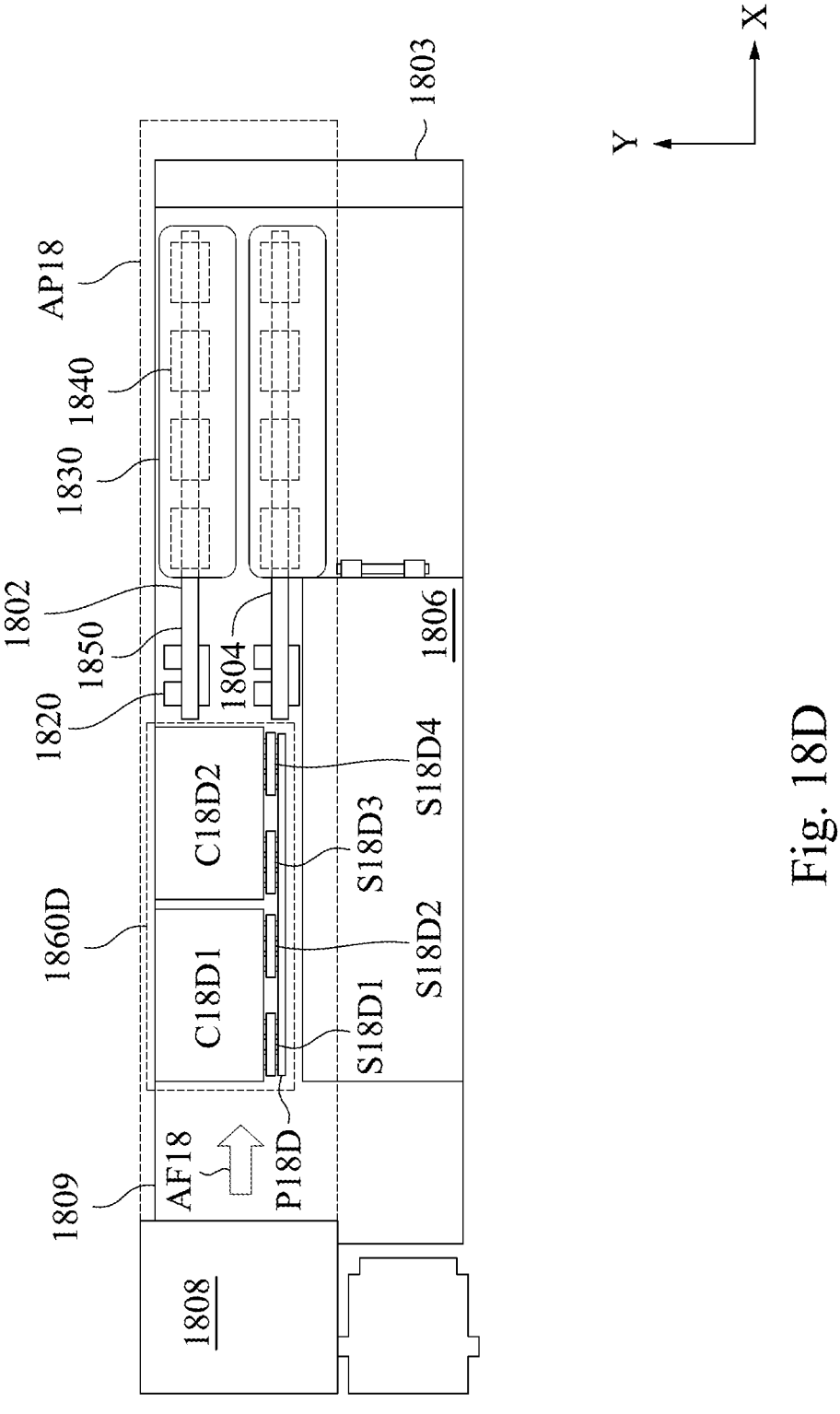

FIG. 18C is a schematic diagram of a power device 1800C according to an exemplary embodiment of the present disclosure. The power device 1800C is an alternative of the power device 1800A shown in FIG. 18A.

The power device 1800C is similar with the power device 1800A shown in FIG. 18A. For brevity, the discussion will focus more on differences between the power devices 1800A and 1800C than on similarities.

As illustratively shown in FIG. 18C, the differences between the power devices 1800A and 1800C include that the power device 1800C includes a regulator 1860C. The regulator 1860C is disposed on the mainboard 1809. In some embodiments, the regulator 1860C is configured to provide at least one voltage to at least one of the power modules 1802, 1804.

As illustratively shown in FIG. 18C, the regulator 1860C includes regulator modules BC181 and BC182. In some embodiments, the regulator module BC181 includes a PCB P18C1, a switch S18C, a choke winding W18C, and a choke core. The PCB P18C1 is disposed on the mainboard 1809. The switch S18C the choke winding W18C, and the choke core are disposed on the PCB P18C1. The choke winding W18C surrounds around the choke core to form the choke C18C. A longitudinal side of the PCB P18C1 is in parallel with the X-direction.

In some embodiments, the regulator module BC182 is arranged beside the power module 1802. The regulator module BC182 is similar with the regulator module BC181, and thus details of the regulator module BC182 are not described herein for brevity. In some other embodiments, the regulator module BC182 is different with the regulator module BC181.

In various embodiments, at least one of the regulator circuit 1210 and 1300A-1300G shown in FIGS. 12, 13A-13G are implemented by at least one of the regulator modules BC181 and BC182.

For example, the regulator module BC181 is configured to operate as the regulator circuit 1210 in some embodiments. The switch S18C and the choke winding W18C correspond to the switch S121 and the choke L121, respectively. In various embodiments, the choke winding W18C corresponds to at least one of the chokes L121, L13A1, L13A2, L13B1, L13C1, L13C2, L13D1, L13E1, L13F1, L13F2, L13G1 and L13G2 shown in FIGS. 12, 13A-13G. In various embodiments, the switch S121 corresponds to at least one of the switches S121, S13A1, S13A2, S13B1, S13B2, S13C1-S13C4, S13D1, S13D2, S13E1-S13E4, S13F1-S13F4, S13G1-S13G6 and/or at least one of the corresponding diodes D121, D13A1, D13A2, D13D1, D13D2, D13F1, D13F2 shown in FIGS. 12, 13A-13G. The number of regulator modules included in the regulator 1860C is not limited. Various numbers of regulator modules are within the contemplated scope of the present disclosure.

According to the power modules 1000 and 1100, a switch circuit and/or a choke is integrated with the power modules. The thermal conductivities of the power devices 1600, 1700A, 1700B, 1700C, 1800A, 1800B, 1800C and 1800D are improved by the arrangement described above. Furthermore, the arrangement of the primary winding 1410B reduces the consumption of the winding poles P14B1-P14B3. The arrangement of the core structures 1531 and 1532 facilitates to control a gap between the inductor L122 and the transformer, and improves a utilization of the PCB 1550 of the power module 1500.

Refer to FIG. 19-25, wherein an embodiment of the present disclosure provides a power device 100 which can be utilized in a server or widely used in related fields. The power device C100 provided by the embodiment of the present disclosure enables elements in the power device C100 to be laid out reasonably through the layout of components and an optimized air passage, and enables a high-density power supply to dissipate heat sufficiently and work stably by optimizing the air passage. In the following passages, specific implementations of the present disclosure will be described with reference to FIG. 19-25.

FIG. 19 is a schematic plan view of a power device C100 according to some embodiments of the present disclosure. FIG. 20 is a circuit diagram of a power conversion circuit C300 according to some embodiments of the present disclosure. FIG. 21 is a simplified functional diagram of the power conversion circuit C300 in FIG. 20. FIG. 22 is a perspective view of a secondary-side module C108 according to some embodiments of the present disclosure. FIG. 23 is a circuit diagram of another power conversion circuit C400 according to some embodiments of the present disclosure. FIG. 24 is an exploded view of a secondary-side module C108 according to some embodiments of the present disclosure. FIG. 25 is a schematic diagram of a secondary-side circuit board C510 according to some embodiments of the present disclosure. As shown in FIG. 19-25, the power device C100 includes a mainboard C190 and the power conversion module C110. The power conversion module C110 includes a primary-side circuit board C106 and the secondary-side module C108. The secondary-side module C108 includes the secondary-side circuit board C510. The primary-side circuit board C106 and secondary-side circuit board C510 are installed on the mainboard C190, so as to make the primary-side circuit board C106, the mainboard C190 and the secondary-side circuit board C510 electrically connected. The primary-side circuit board C106 and the secondary-side circuit board C510 are spatially separated from each other.

It should be noted that making the primary-side circuit board C106 and the secondary-side circuit board C510 spatially separated from each other may reduce the overall volume of the power conversion module compared to an ordinary power conversion module on a primary-secondary all-in-one circuit board. The separated primary-side circuit board C106 may be disposed on other position on the mainboard C190 so as to improve the flexibility of the layout, increase the space utilization and increase the power density. At the same time, compared to the ordinary power conversion module on a primary-secondary all-in-one circuit board, the power path provided in the present disclosure flows from the primary-side circuit board C106, through the mainboard C190 and to the secondary-side circuit board C510, and thereby enables a more flexible adjustment on the power path.

More specifically, according to some embodiments of the present disclosure, the mainboard C190 of the power device C100 includes a first side C191, a second side C192, a third side C193 and a fourth side C194. The first side C191 and the third side C193 are set along a first direction X, the second side C192 and the fourth side C194 are set along a second direction Y. The first side C191 and the third side C193 are opposite to each other, the second side C192 and the fourth side C194 are opposite to each other. The first direction X and the second direction Y are perpendicular to each other. The first side C191 is connected to the second side C192, the second side C192 is connected to the third side C193, and the third side C193 is connected to the fourth side C194.

More specifically, refer to FIG. 19 and FIG. 22, wherein the secondary-side module C108 further includes a first magnetic core element C520 and secondary-side elements (e.g., secondary-side switches Q5 and Q6). The secondary-side elements and the first magnetic core element C520 are disposed on the secondary-side circuit board C510. The secondary-side elements and the first magnetic core element C520 are disposed adjacent to each other and along a third direction Z that is perpendicular to the first direction X and the second direction Y (i.e., the first direction X, the second direction Y and the third direction Z are all perpendicular to each other, and the Z direction in FIG. 19 is perpendicular to the paper). The secondary-side elements are disposed in the vicinity of the mainboard C190, that is, below the first magnetic core element in FIG. 22, which makes the power path from the secondary-side module C108 to the mainboard C190 the shortest. The first magnetic core element C520 is disposed away from the mainboard C190. The first magnetic core element C520 is disposed on the secondary-side circuit board C510 to form a transformer Tx. More specifically, a primary winding and a secondary winding (not depicted) are disposed on the circuit board. The first magnetic core element C520 along with the primary winding and the secondary winding disposed on the secondary-side circuit board C510 forms the transformer Tx.

Refer to FIG. 22 again, wherein in some embodiments of the present disclosure, the secondary-side module C108 further includes a second magnetic core element C530. The second magnetic core element C530 is disposed on the secondary-side circuit board C510. The first magnetic core element C520 and the second magnetic core element C530 are disposed adjacent to each other and along the first direction X. The second magnetic core element C530 is disposed away from the third side C193. The second magnetic core element C530 is disposed on the secondary-side circuit board C510 to form an inductor Lr (e.g., a harmonic inductor). More specifically, an inductor winding (not depicted) is disposed on the circuit board. The second magnetic core element C530 along with the inductor winding disposed on the secondary-side circuit board C510 forms the inductor Lr.

In some embodiments of the present disclosure, N secondary-side modules C108 are disposed on the mainboard C190. The N secondary-side module C108 are disposed along the second direction Y. Inside each secondary-side module C108, transformers Tx formed by the first magnetic core element C520 and the secondary-side circuit board C510 are connected in parallel to each other. Inside each secondary-side module C108, the inductors Lr (e.g., harmonic inductors) formed by the second magnetic core element C530 and the secondary-side circuit board C510 are connected in serial to each other. The specific number of secondary-side modules C108 should be chosen according to the practical power, where there are two inside the secondary-side module C108. FIG. 23 is a circuit diagram of another power conversion circuit C400 according to some embodiments of the present disclosure which illustrates the layout of the primary-side circuit board C106 and the secondary-side module C108. Primary-side switches Q1-Q4 along with their driving circuits and harmonic capacitors Cr1, Cr2 are disposed on the primary-side circuit board C106. Harmonic inductors Lr1, Lr2 and transformers T1, T2, magnetizing inductors Lm1, Lm2 and secondary-side switches Q5-Q8 along with their driving circuits are disposed on two secondary-side modules C108. The primary-side circuit board C106 and the secondary-side module C108 are connected through the circuit of the mainboard C190 as shown on FIG. 19. An input voltage Vin is inputted to the power conversion circuit C400. The power conversion circuit C400 provides an output voltage Vou through an output capacitor Co. It is shown in FIG. 23 that the two transformers T1, T2 are connected in parallel to each other and the two harmonic inductors Lr1, Lr2 are connected in serial to each other.

In some embodiments of the present disclosure, as shown in FIG. 22, wherein an air gap G is formed between the first magnetic core element C520 and the second magnetic core element C530. That is, the first magnetic core element C520 and the second magnetic core element C530 are spatially separated from each other. In other embodiments of the present of the present disclosure, the first magnetic core element C520 and the second magnetic core element C530 may be all-in-one, that is, no air gap is formed between them.

In some embodiments of the present disclosure, as shown in FIG. 24, the first magnetic core element C520 includes a first magnetic cover C521 and a second magnetic cover C522. The second magnetic core element C530 includes a third magnetic cover C531 and a fourth magnetic cover C532, wherein winding poles and side poles are disposed on the first magnetic cover C521, second magnetic cover C522, third magnetic cover C531 and the fourth magnetic cover C532. A first opening C541 and a second opening C542 are disposed on the secondary-side circuit board C510. The winding poles of the first magnetic cover C521 and the second magnetic cover C522 are disposed through the first opening C541 and the secondary-side circuit board C510 to form the transformer Tx. The winding poles of the third magnetic cover C531 and the fourth magnetic cover C532 are disposed through second opening C542 and the secondary-side circuit board C510 to form the inductor Lr.

In some embodiments of the present disclosure, as shown in FIG. 24, each secondary-side module C108 includes a first secondary-side circuit board C511 and a second secondary-side circuit board C512. First openings C541 and second openings C541 are disposed on the first secondary-side circuit board C511 and the second secondary-side circuit board C512. The winding pole of the first magnetic cover C521 is disposed through the first opening C541 on the first secondary-side circuit board C511. The winding pole of the second magnetic cover C522 is disposed through the first opening C541 of the second secondary-side circuit board C512. The winding pole of the third magnetic cover C531 is disposed through the second opening C542 of the first secondary-side circuit board C511. The winding pole of the fourth magnetic cover C532 is disposed through the second opening C542 of the second secondary-side circuit board C512. In some embodiments of the present disclosure, the primary windings on the first secondary-side circuit board C511 and the second secondary-side circuit board C512 are connected in serial to each other, and the secondary windings are connected in parallel to each other.

In some embodiments of the present disclosure, a first pin C551 and a second pin C552 are disposed on the secondary-side circuit board C510. The first pin C551 and the second pin C552 are inserted on the mainboard C190 and electrically connected to the mainboard C190. The first pin C551 is electrically connected to the primary-side circuit board C106 through the mainboard C190. The projection of the second magnetic core element C530 on the mainboard C190 covers the projection of the first pin C511 on the mainboard C190 completely, as shown in FIG. 23, wherein the first pin C551 is disposed below the second magnetic core element C530 along the third direction Z. In addition, referring to FIG. 20 and FIG. 23, since the first pin C511 is connected to the primary-side circuit board C106 through the main-board C190, the power of the primary-side circuit board C106 flows to the harmonic inductor Lr formed by the second magnetic core element C530 and secondary-side circuit board C510 through the first pin C551, and since the voltage levels of the primary-side circuit and the secondary-side circuit are different, a safe distance should be reserved between them. Therefore, the first pin C551 belongs to the primary-side, so it should be placed a safe distance away from the secondary-side circuit (i.e., the second pin C552, secondary-side circuit board C510 and the secondary-side element). More specifically, a predetermined safe distance may be set between the first pin C551 and the second pin C552. According to the standard, the safe distance may be 6.8 mm.

In some embodiments of the present disclosure, as shown in FIG. 20 and FIG. 23, the secondary-side circuits of the power conversion circuits C300, C400 are full-wave rectifier circuits, or medium-pump rectifier circuit. In other embodiments of the present disclosure, the secondary-side circuits may be bridge rectifier circuits or other circuits that are capable of rectifying, the present disclosure is not limited thereto.

In some embodiments of the present disclosure, as shown in FIG. 25, along the second direction Y, the first pin C551 includes a first surface C5511 and a second surface C5512 which are disposed face to face. The first surface C5511 is used as an electricity input terminal. The second surface C5512 is used as an electricity output terminal. Using the two surfaces of a pin as input and output simultaneously may reduce the number of pins effectively, and thereby reduce the volume and improve the space utilization and increase the power density.

The power conversion module C110 is disposed on the mainboard C190. A fan C101 is disposed on a first corner of the mainboard C190, wherein the first corner is in the vicinity of the first side C191 and the second side C192. The air flow from the fan C101 flows against a first horizontal area C121 along the first direction X The fan C101 and the power conversion module 110 are both located at the first horizontal area C121. The air flow from the fan C101 flows against the power conversion module C110. The fan C101 and the power conversion module C110 are both located at the first horizontal area C121 along the direction of the air flow, so as to improve the heat dissipation of the power conversion module C110.

As shown in FIG. 19, along the second direction Y, the power device C100 further includes a power factor correction inductor C104, a power factor correction board C105 and the primary-side circuit board C106, wherein the power factor correction inductor C104, the power factor correction board C105 and the primary-side circuit board C106 are all disposed on the mainboard 190 and arranged in parallel and spaced apart from each other, and the power factor correction inductor C104 is disposed adjacent to the second side C192. Placing the power factor correction inductor C104 to be adjacent to the power factor correction board C105 and disposing the primary-side circuit board C106 below the power factor correction board C105 may make the power flows in a top-to-down manner, that is, flows from the power factor correction inductor C104 to the power factor correction board C105, and to the primary-side circuit board C106 in the power path, so as to promise the power flow out of the primary-side circuit board C106 will not be affected by the interference from the power factor correction inductor C104 and the power factor correction board C105. In some embodiments of the present disclosure, the number of power factor correction inductors C104 is two.

At the same time, the power factor correction board C105 is located between the power factor correction inductor C104 and the primary-side circuit board C106, wherein the length direction of any one of the power factor correction inductor C104, the power factor correction board C105 and the primary-side circuit board C106 is almost parallel to the air flow direction of the wind from the fan C101. The fan C101, the power factor correction inductor C104, the power factor correction board C105 and the primary-side circuit board C106 are all locate at the first horizontal area C121 along the direction of the air flow, so as to improve the heat dissipation, and the power path is shorter. That is, arranging the power factor correction inductor C104, the power factor correction board C105 and the primary-side circuit board C106 in parallel and spaced apart from each other will improve the effectiveness of air passage of the fan, and will benefit the heat dissipation of the power device C110.

In some embodiments of the present disclosure, the power factor correction inductor C104, the power factor correction board C105 and the power conversion module C110 are all located at the first horizontal area C121 of the mainboard C190 along the first direction X.

In some embodiments of the present disclosure, the power device C100 further includes a connector C102. The connector C102 is disposed at a second corner on the mainboard C190, wherein the second is in the vicinity of the first side C191 and the fourth side C194. The connector C102 is disposed in the vicinity of the fan C101 along the second direction Y.

In some embodiments of the present disclosure, the power device C100 further includes an electromagnetic interference filtering module C103. The electromagnetic interference filtering module C103 is disposed on the mainboard C190 and along the first direction X. The connector C102 and the power conversion module C110 are located at the two opposite sides of the electromagnetic interference filtering module C103, respectively.

It should be noted that, the terms "around", "about" or "approximately" in the present disclosure are used to modify any quantities that may vary slightly, but such slight variation does not change its essence. If not expressly stated, the terms "around", "about" or "approximately" shall generally mean within 20 percent, preferably within 10 percent, and more preferably within 5 percent of a given value or range.

As shown in FIG. 19, the power factor correction inductor C104, the power factor correction board C105 and the power conversion module C110 are all located between the secondary-side module C108 and the fan C101. The fan C101 and the secondary-side module C108 are all located at the first horizontal area C121 along the direction of the air flow, so as to benefit the heat dissipation.

In some embodiments of the present disclosure, the power device C100 further includes an energy storing capacitor C107. The energy storing capacitor C107 is disposed on the mainboard C190. The energy storing capacitor C107 is disposed in the vicinity of the fourth side C194 and along the second direction Y. The energy storing capacitor C107 is located between the fourth side C194 and the primary-side circuit board C106. The energy storing capacitor C107 with a larger volume is located below the primary-side circuit board C106, so as to block the air flow, which directs the air flow to the power factor correction inductor C104, the power factor correction board C105, primary-side circuit board C106 and the secondary-side module C108 better.

In some embodiments of the present disclosure, the power device C100 further includes an auxiliary power and a control board module C109. The auxiliary power and the control board module C109 are located at a third corner of the mainboard C190. The third corner is in the vicinity of the third side C193 and the fourth side C194. The connector C102, the electromagnetic interference filtering module C103, the energy storing capacitor C107, the auxiliary power and the control board module C109 are arranged at a second horizontal area C122 along the first direction X. The second horizontal area C122 and the first horizontal area C121 are parallel to each other without overlapping. For example, the auxiliary power and the control board module C109 includes modules such as the auxiliary power and the control board with less heat and are not demanding on heat dissipation may be located at the farthest corner from the fan C101 on the mainboard C190, located at the second horizontal area C122 with the energy storing capacitor C107 with a larger volume. For example, the control board controls the fan C101 and the power conversion module C110 in a fully digital manner.

In some embodiments of the present disclosure, the fan C101, the connector C102, the power factor correction inductor C104, the power factor correction board C105, the primary-side circuit board C106, the energy storing capacitor C107, the secondary-side module C108, the auxiliary power and the control board module C109 all mount on the mainboard C190. The filtering element (not depicted) of the electromagnetic interference filtering module C103 mounts on the mainboard C190 and is located between the connector C102 and the energy storing capacitor C107. The rest of the circuit of the electromagnetic interference filtering module C103 lies on the mainboard C190. Therefore, the height of the rest of the circuit of the electromagnetic interference filtering module C103 is much lower than those of the fan C101 and the power conversion module C110. The rest of the circuit of the electromagnetic interference filtering module C103 will not hinder the path to the plurality of power module C110 of the air flow. The term "mounting" hereinafter means set along the third direction Z. In the first horizontal area C121, the height of the fan C101 is higher than that of the electromagnetic interference filtering module C103. That is, the height of the fan C101 is higher than that of the rest of the circuit of the electromagnetic interference filtering module C103. In some embodiments of the present disclosure, the number of the filtering elements is two.

For example, the fan C101, the connector C102, the electromagnetic interference filtering module C103, the power factor correction inductor C104, the power factor correction board C105, the primary-side circuit board C106, the energy storing capacitor C107, the secondary-side module C108, the auxiliary power and the control board module C109 on the mainboard C190 are all modular devices. The electrical connection between the aforementioned modular devices on the mainboard C190 may be realized by the mainboard C190. Some of the modular devices on the mainboard C190 may also choose not to realize the electrical connection by the mainboard C190. It should be understood that in the description herein and throughout the claims that follow, the description of "electrical connection" may generally refer to one component being electrically coupled to another component through other component indirectly, or one component electrically connected to another component without other component.

As shown in FIG. 19, the power path inside the power device C100 can be described as follows: the input power flows into the power device C100 through the input connector C102 at first, and is connected to the power factor correction inductor C104 after flowing through the electromagnetic interference filtering module C103, and flows into the next stage of primary-side circuit board C106 after flowing through the power factor correction board C105, and finally flows out of the power device C100 through the secondary-side module C108 and outputs by the output terminal.

FIG. 20 is a circuit diagram of a power conversion circuit C300 according to some embodiments of the present disclosure; FIG. 21 is a simplified functional diagram of the power conversion circuit C300 in FIG. 20. As shown in FIG. 20-21, the layouts of the primary-side circuit board C106 and the secondary-side module C108 are shown. The primary-side switches Q1-Q4 and their driving circuits, the harmonic capacitor Cr are disposed on the primary-side circuit board C106. The harmonic inductor Lr, the transformer T1, the magnetizing inductor Lm, the secondary-side switches Q5, Q6 and their driving circuits are disposed at the secondary-side module C108. The primary-side circuit board C106 and the secondary-side module C108 are connected through the circuit on the mainboard C190 as shown in FIG. 19. The input voltage Vin is inputted to the power conversion circuit C300, and the power conversion circuit C300 provides the output voltage Vout through an output inductor Lo and an output capacitor Co.

FIG. 22 is a perspective view of a secondary-side module C108 according to some embodiments of the present disclosure. As shown in FIG. 22, the secondary-side module C108 adopts a modular circuit design. A secondary-side circuit board (PCB) C510 integrates a complete circuit including secondary-side elements (e.g., secondary-side switches Q5 and Q6), the harmonic inductor Lr, the transformer T1, wherein the windings of magnetic elements such as the harmonic inductor Lr and the transformer T1 are formed by paving copper in the secondary-side circuit board C510, which may improve the power density and reduce the volume of the circuit. Larger magnetic elements on the modular circuit (i.e., the harmonic inductor Lr and the transformer T1) may block the air passage and direct the air flow to the secondary-side switches Q5 and Q6 with severe heat generation, which increases the effectiveness of heat dissipation.

In summary, the technical solution provided in the present disclosure has apparent advantages and benefits compared to the prior art. The reasonable layout of the power device C100 in the present disclosure optimizes the power path. The power device C100 in the present disclosure adopts a modular circuit design which reduces the volumes of the magnetic elements and increases the power density of the power supply. The present disclosure also provides an optimized air passage which enables the high-density power supply to dissipate heat sufficiently and to work stably.

Although the present disclosure has been described in considerable detail with reference to certain embodiments thereof, other embodiments are possible. Therefore, the spirit and scope of the appended claims should not be limited to the description of the embodiments contained herein. It will be apparent to people having ordinary skill in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A power device, comprising:
 a mainboard, comprising a first side and a third side opposite each other along a first direction, and a second side and a fourth side opposite each other along a second direction, wherein the first direction is perpendicular to the second direction; and a power conversion module, comprising a primary-side circuit board and a secondary-side module;

wherein the secondary-side module comprises a secondary-side circuit board, the primary-side circuit board and the secondary-side circuit board are both disposed on the mainboard, such that the primary-side circuit board, the mainboard and the secondary-side circuit board are electrically connected, the primary-side circuit board and the secondary-side circuit board are spatially separated, and the secondary-side circuit board is disposed adjacent to the third side along the first direction, the primary-side circuit board is disposed away from the third side, the secondary-side module further comprises a secondary-side element and a first magnetic core element, wherein the secondary-side element and the first magnetic core element are disposed on the secondary-side circuit board along a third direction perpendicular to the first direction and the second direction, the secondary-side element and the first magnetic core element are adjacent to each other, the secondary-side element is disposed adjacent to the mainboard, the first magnetic core element is disposed away from the mainboard, and the first magnetic core element is disposed on the secondary-side circuit board to form a transformer.

2. The power device of claim 1, wherein the secondary-side module further comprises a second magnetic core element, the second magnetic core element is disposed on the secondary-side circuit board, wherein along the first direction, the first magnetic core element and the second magnetic core element are disposed adjacent to each other, and the second magnetic core element is disposed away from the third side, and the second magnetic core element is disposed on the secondary-side circuit board to form an inductor.

3. The power device of claim 2, wherein N secondary-side modules are disposed on the mainboard, the N secondary-side modules are disposed along the second direction, wherein the transformers inside the N secondary-side modules connected to each other in parallel, and the inductors inside the N secondary-side modules connected to each other in serial.

4. The power device of claim 2, wherein the first magnetic core element and the second magnetic core element are all-in-one.

5. The power device of claim 2, wherein an air gap is formed between the first magnetic core element and the second magnetic core element.

6. The power device of claim 2, wherein the first magnetic core element comprises a first magnetic cover and a second magnetic cover, the second magnetic core element comprises a third magnetic cover and a fourth magnetic cover, and a winding pole and a side pole are disposed on each of the first magnetic cover, the second magnetic cover, the third magnetic cover and the fourth magnetic cover, a first opening and a second opening are disposed on the secondary-side circuit board, wherein the winding poles of the first magnetic cover and the second magnetic cover are disposed through the first opening and the secondary-side circuit board to form the transformer, the winding poles of the third magnetic cover and the fourth magnetic cover are disposed through the second opening and the secondary-side circuit board to form the inductor.

7. The power device of claim 2, wherein a first pin and a second pin are disposed on the secondary-side circuit board, the first pin and the second pin are inserted on the mainboard and electrically connected to the mainboard, and the first pin is electrically connected to the primary-side circuit board through the mainboard, a projection of the second magnetic core element on the mainboard covers a projection of the first pin on the mainboard.

8. The power device of claim 7, wherein the first pin is separated from the second pin by a safe distance.

9. The power device of claim 7, wherein the first pin comprises a first surface and a second surface opposite each other along the second direction, wherein the first surface is configured to be used as an electricity input terminal, and the second surface is configured to be used as an electricity output terminal.

10. The power device of claim 6, wherein the secondary-side module comprises a first secondary-side circuit board and a second secondary-side circuit board, the first opening and the second opening are disposed on each of the first secondary-side circuit board and the second secondary-side circuit board, the winding pole of the first magnetic cover is disposed through the first opening of the first secondary-side circuit board, the winding pole of the second magnetic cover is disposed through the first opening of the second secondary-side circuit board, the winding pole of the third magnetic cover is disposed through the second opening of the first secondary-side circuit board, the winding pole of the fourth magnetic cover is disposed through the second opening of the second secondary-side circuit board.

11. The power device of claim 1, further comprising:

a power factor correction inductor, disposed on the mainboard; and a power factor correction board, disposed on the mainboard;

wherein the power factor correction inductor, the power factor correction board and the primary-side circuit board are arranged in parallel and spaced apart from each other along the second direction, and the power factor correction inductor is disposed adjacent to the second side.

12. The power device of claim 11, wherein the power factor correction inductor, the power factor correction board and the power conversion module are all disposed in a first horizontal area of the mainboard along the first direction.

13. The power device of claim 1, further comprising:

a fan, disposed on a first corner of the mainboard, wherein the first corner is adjacent to the first side and the second side, an air flow of the fan flows through a first horizontal area, the fan and the power conversion module are both located in the first horizontal area.

14. The power device of claim 13, further comprising:

a connector, disposed on a second corner of the mainboard, wherein the second corner is adjacent to the first side and the fourth side, and the connector is disposed adjacent to the fan along the second direction.

15. The power device of claim 14, further comprising:

an electromagnetic interference filtering module, disposed on the mainboard along the first direction, wherein the connector and the power conversion module are located at two opposite sides of the electromagnetic interference filtering module.

16. The power device of claim 15, further comprising:

an energy storing capacitor, disposed on the mainboard, wherein the energy storing capacitor is disposed adjacent to the fourth side, the energy storing capacitor is located between the fourth side and the primary-side circuit board along the second direction.

17. The power device of claim 16, further comprising:

an auxiliary power and a control board module, disposed on a third corner of the mainboard, wherein the third corner is adjacent to the third side and the fourth side, the auxiliary power and the control board module are located between the secondary-side circuit board and the fourth side.

18. The power device of claim 17, wherein the connector, the electromagnetic interference filtering module, the energy storing capacitor, the auxiliary power and the control board module are arranged in a second horizontal area along the first direction, and the second horizontal area is parallel to the first horizontal area without overlapping.

\* \* \* \* \*